US00RE50519E

(19) United States
(12) Reissued Patent
Oh et al.

(10) Patent Number: US RE50,519 E
(45) Date of Reissued Patent: *Aug. 5, 2025

(54) CROSS-POINT MEMORY DEVICE AND METHOD FOR CONVERTING AND STORING WRITE DATA AND ASSOCIATED PARITY TO ACHIEVE UNIFORM BIT ERROR RATES

(71) Applicant: Samsung Electronics Co., Ltd., Suwon-si (KR)

(72) Inventors: Eun-chu Oh, Hwaseong-si (KR); Pil-sang Yoon, Hwaseong-si (KR); Jun-jin Kong, Yongin-si (KR); Hong-rak Son, Anyang-si (KR)

(73) Assignee: Samsung Electronics Co., Ltd., Gyeonggi-do (KR)

( * ) Notice: This patent is subject to a terminal disclaimer.

(21) Appl. No.: 17/702,165

(22) Filed: Mar. 23, 2022

Related U.S. Patent Documents

Reissue of:
(64) Patent No.: 10,741,245
Issued: Aug. 11, 2020
Appl. No.: 16/161,285
Filed: Oct. 16, 2018

U.S. Applications:
(63) Continuation of application No. 14/968,016, filed on Dec. 14, 2015, now Pat. No. 10,127,978.

(30) Foreign Application Priority Data

Dec. 15, 2014 (KR) ..... 10-2014-0180491

(51) Int. Cl.
*G11C 13/00* (2006.01)
*G06F 11/10* (2006.01)
(Continued)

(52) U.S. Cl.
CPC ..... *G11C 13/0069* (2013.01); *G06F 11/1048* (2013.01); *G06F 12/00* (2013.01);
(Continued)

(58) Field of Classification Search
CPC ..... H03M 13/05; H03M 13/27; G11C 8/06; G11C 13/0069; G11C 13/004;
(Continued)

(56) References Cited

U.S. PATENT DOCUMENTS 4,564,944 A * 1/1986 Arnold ..... H03M 13/05 714/759
6,085,348 A * 7/2000 Shimizu ..... G11B 20/1809
(Continued)

FOREIGN PATENT DOCUMENTS

CN 101641747 A 2/2010
CN 103295627 A 9/2013
(Continued)

OTHER PUBLICATIONS

Gay, et al. "Memory management with explicit regions". ACM Sigplan Notices, vol. 33, Issue 5, pp. 313-323. (May 1998). https://doi.org/10.1145/277652.277748 (Year: 1998).*
(Continued)

*Primary Examiner* — B. James Peikari
(74) *Attorney, Agent, or Firm* — Harness, Dickey & Pierce, P.L.C.

(57) ABSTRACT

A method of operating a resistive memory system including a plurality of layers may include receiving a write request and first data corresponding to a first address, converting the first address into a second address and assigning n (n is an integer equal to or larger than 2) pieces of sub-region data generated from the first data to the plurality of layers, and writing the n pieces of sub-region data to at least two layers according to the second address.

19 Claims, 27 Drawing Sheets

(51) Int. Cl.

| | |
|---|---|
| ***G06F 12/00*** | (2006.01) |
| ***G06F 12/02*** | (2006.01) |
| ***G11C 8/06*** | (2006.01) |
| ***H03M 13/05*** | (2006.01) |
| ***H03M 13/27*** | (2006.01) |

(52) U.S. Cl.
CPC ..... *G06F 12/0238* (2013.01); *G11C 8/06* (2013.01); *G11C 13/0023* (2013.01); *G11C 13/004* (2013.01); *H03M 13/05* (2013.01); *H03M 13/27* (2013.01); *G06F 2212/7201* (2013.01); *G06F 2212/7202* (2013.01); *G11C 13/0004* (2013.01); *G11C 2013/0088* (2013.01); *G11C 2213/71* (2013.01); *G11C 2213/72* (2013.01)

(58) Field of Classification Search
CPC ..... G11C 13/0023; G11C 13/0004; G11C 2013/0088; G11C 2213/72; G11C 2213/71; G06F 12/00; G06F 12/0238; G06F 11/1048; G06F 2212/7201; G06F 2212/7202
See application file for complete search history.

(56) References Cited

U.S. PATENT DOCUMENTS

| | | | | |
|---|---|---|---|---|
| 7,095,648 | B2 | 8/2006 | Ditewig et al. | |
| 7,974,118 | B2 | 7/2011 | Choi et al. | |
| 8,136,017 | B2 | 3/2012 | Oh et al. | |
| 8,391,082 | B2 | 3/2013 | Nagashima et al. | |
| 8,427,885 | B2 | 4/2013 | Mukai et al. | |
| 8,427,930 | B1 | 4/2013 | Deguchi | |
| 8,456,940 | B2 | 6/2013 | Hanzawa et al. | |
| 8,488,399 | B2 | 7/2013 | Yu et al. | |
| 8,507,889 | B2 | 8/2013 | Nagashima | |
| 8,582,345 | B2 | 11/2013 | Hosono | |
| 8,644,072 | B2 | 2/2014 | Nagashima | |
| 8,645,637 | B2 | 2/2014 | Mirichigni et al. | |
| 8,677,216 | B2 | 3/2014 | Park et al. | |
| 8,773,939 | B2 | 7/2014 | Oh et al. | |
| 2002/0053050 | A1* | 5/2002 | Senshu | H03M 13/276 714/701 |
| 2007/0245215 | A1* | 10/2007 | Hwang | H03M 13/2906 714/758 |
| 2008/0244370 | A1* | 10/2008 | Lam | G11C 11/5621 714/803 |
| 2009/0089646 | A1* | 4/2009 | Hirose | G11C 7/1012 714/766 |
| 2009/0177833 | A1 | 7/2009 | Norman | |
| 2010/0162065 | A1 | 6/2010 | Norman | |
| 2010/0238705 | A1* | 9/2010 | Kim | G11C 13/00 365/189.14 |
| 2010/0277968 | A1* | 11/2010 | Tokiwa | G11C 7/1042 365/148 |
| 2011/0131735 | A1 | 6/2011 | Park et al. | |
| 2011/0167319 | A1* | 7/2011 | Jeddeloh | G06F 11/1044 714/763 |
| 2011/0231735 | A1 | 9/2011 | Park et al. | |
| 2011/0307758 | A1* | 12/2011 | Fillingim | G06F 11/1048 714/E11.03 |
| 2012/0063194 | A1 | 3/2012 | Baek et al. | |
| 2013/0016557 | A1 | 1/2013 | Kim | |
| 2013/0044538 | A1 | 2/2013 | Oh et al. | |
| 2013/0173956 | A1* | 7/2013 | Anderson | H03M 13/373 714/6.24 |
| 2014/0181457 | A1 | 6/2014 | Hsu et al. | |

FOREIGN PATENT DOCUMENTS

| | | | |
|---|---|---|---|
| KR | 10-2008-0080882 | A | 9/2008 |
| KR | 10-2011-0105257 | A | 9/2011 |
| KR | 10-2011-0128047 | A | 11/2011 |
| KR | 10-2012-0127973 | A | 11/2012 |

OTHER PUBLICATIONS

"GPU Framebuffer Memory: Understanding Tiling" Samsung Developer. Website accessed Sep. 7, 2024. https://developer.samsung.com/galaxy-gamedev/resources/articles/gpu-framebuffer.html (Year: 2024).*

Korean Notice of Allowance dated Mar. 4, 2021 issued in corresponding Korean Patent Appln. No. 10-2014-0180491.

Tz-Yi Liu et al. "A 130.7-mm$^2$ 2-Layer 32-Gb ReRAM Memory Device in 24-nm Technology". IEEE Journal of Solid-State Circuits, vol. 49, No. 1. Jan. 2014. pp. 140-153.

Chinese Office Action dated Mar. 25, 2020 for CN 201510931245.0.

* cited by examiner

FIG. 15
(Amended)
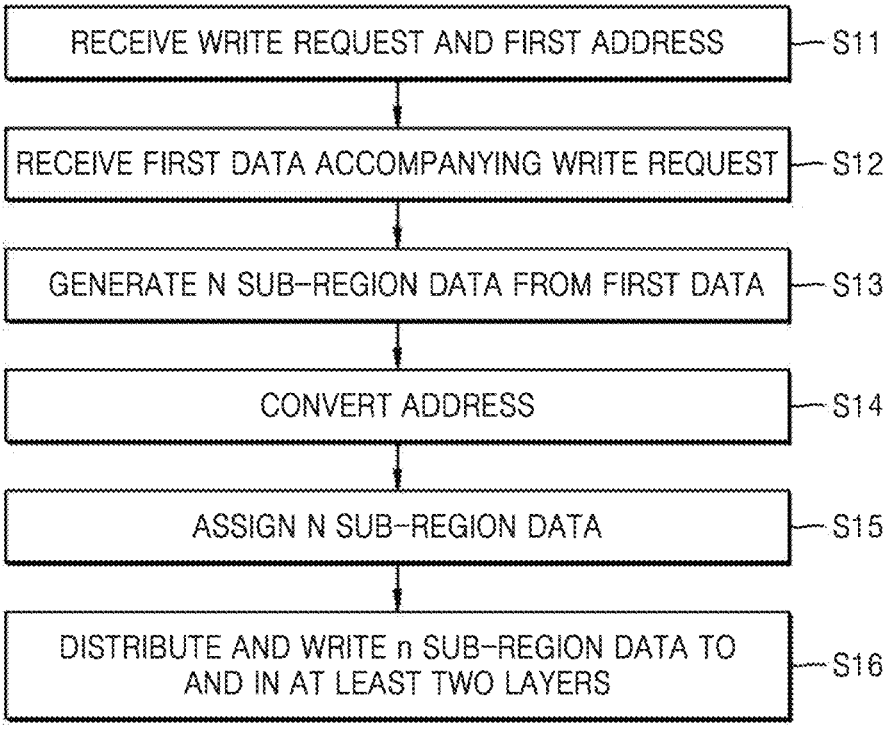

CROSS-POINT MEMORY DEVICE AND METHOD FOR CONVERTING AND STORING WRITE DATA AND ASSOCIATED PARITY TO ACHIEVE UNIFORM BIT ERROR RATES

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATION

This application *is a reissue application for U.S. Pat. No. 10,741,245 issued on Aug. 11, 2020 on U.S. Ser. No. 16/161,285 filed Oct. 16, 2018, which* is a continuation of U.S. application Ser. No. 14/968,016, filed on Dec. 14, 2015, which claims priority under 35 U.S.C. § 119 to Korean Patent Application No. 10-2014-0180491, filed on Dec. 15, 2014, in the Korean Intellectual Property Office, the entire contents of each of which is incorporated herein in its entirety by reference.

BACKGROUND

Example embodiments of the inventive concepts relate to a resistive memory device. For example, at least some example embodiments relate to a resistive memory device a plurality of layers, a resistive memory system including a plurality of layers, and/or a method of operating the resistive memory system.

As the demand for memory devices with high capacity and low power consumption memory device increase, next generation memory devices that are non-volatile and do not need refresh have been researched. The next generation memory device may have a high integrity of dynamic random access memory (DRAM), a fast response of static RAM (SRAM), etc. Phase change RAM (PRAM), nano floating gate memory (NFGM), polymer RAM (PoRAM), magnetic RAM (MRAM), ferroelectric RAM (FeRAM), resistive RAM (RRAM), etc. may be examples of next generation memory device satisfying the above requirements.

SUMMARY

Example embodiments of the inventive concepts provide a resistive memory device, a resistive memory system, and/or a method of operating the resistive memory system, which may improve degradation of data reliability due to differences in characteristics among a plurality of layers.

At least some example embodiments of the inventive concepts are related to a method of operating a resistive memory system that includes a plurality of layers.

In some example embodiments, the method includes receiving a write request and first data corresponding to a first address, assigning n (n is an integer equal to or larger than 2) pieces of sub-region data generated from the first data to the plurality of layers by converting the first address into a second address, and writing the n pieces of sub-region data to at least two layers according to the second address.

At least some example embodiments of the inventive concepts relate to a method of operating a resistive memory system including a plurality of layers.

In some example embodiments, the plurality of layers are classified into a plurality of tiles. The method includes generating first and second sub-region data from first-region data accompanying a first write request, selecting a path for transmitting the first and second sub-region data to the plurality of layers, and writing the first sub-region data to a first layer of a first tile and writing the second sub-region data to a second layer of a second tile.

At least some example embodiments of the inventive concepts relate to a method of operating a memory controller.

In some example embodiments, the memory controller controls a write operation on memory cells disposed in a plurality of layers. The method includes receiving a write request and data corresponding to the write request from a host, generating n pieces of sub-region data by performing a first processing operation on the data, assigning the n pieces of region data to the plurality of layers based on an address conversion operation, and controlling a write operation to write at least two region data in different layers.

At least some example embodiments relate to a resistive memory device.

In some example embodiments, the resistive memory device includes a memory cell array including resistive memory cells included in a plurality of layers, a read/write circuit configured to perform a write operation and a read operation on the resistive memory cells, a control logic configured to control the write and read operations on the resistive memory cells according to a received command and a received address, and a layer assignment unit configured to assign data accompanying the received command to the plurality of layers. A plurality of pieces of sub-region data into which region data corresponding to a first address is classified are simultaneously written to at least two layers.

At least some example embodiments relate to a method of controlling a memory device.

In some example embodiments, the method includes splitting write data into n pieces of sub-region data; assigning the n pieces of sub-region data to at least two layers of a memory cell array associated with the memory device; and writing the n pieces of sub-region data to the at least two layers.

In some example embodiments, the method further includes converting a logical address associated with the data to a first physical address of the memory device; and converting the first physical address to a plurality of second physical addresses, the second physical addresses indicating physical positions to store the n pieces of sub-region data, wherein the assigning assigns the n pieces of sub-region data to the at least two layers based on the second physical addresses.

In some example embodiments, the assigning includes generating layer selection information using a mapping table indicating a relationship between the first physical address associated with the sector data and the second physical address associated with the plurality of sub-sector data; and sending the layer selection information to multiplexers associated with the memory device, wherein the layer selection information instructs the multiplexers to assign the n pieces of sub-region data among the at least two layers.

In some example embodiments, the at least two layers each have a plurality of tiles associated therewith, the multiplexers respectively correspond to the plurality of tiles, and the multiplexers are configured to provide the n pieces of sub-region data to respective ones of the at least two layers according to the second physical address.

In some example embodiments, the splitting includes applying an error correction code (ECC) to the input data to generate region data, the sector data including the region data and parity data; and splitting the region data into the n pieces of sub-region data, each of the plurality of sub-region data having a size corresponding to an error correction unit.

In some example embodiments, the assigning assigns the n pieces of sub-region data to at least two layers such that a bit error rate is uniformly distributed among the sub-region data.

BRIEF DESCRIPTION OF THE DRAWINGS

Example embodiments of the inventive concepts will be more clearly understood from the following detailed description taken in conjunction with the accompanying drawings in which:

FIG. 15 is a flowchart for describing a method of operating a memory system according to an example embodiment;

DETAILED DESCRIPTION

Figure 1:
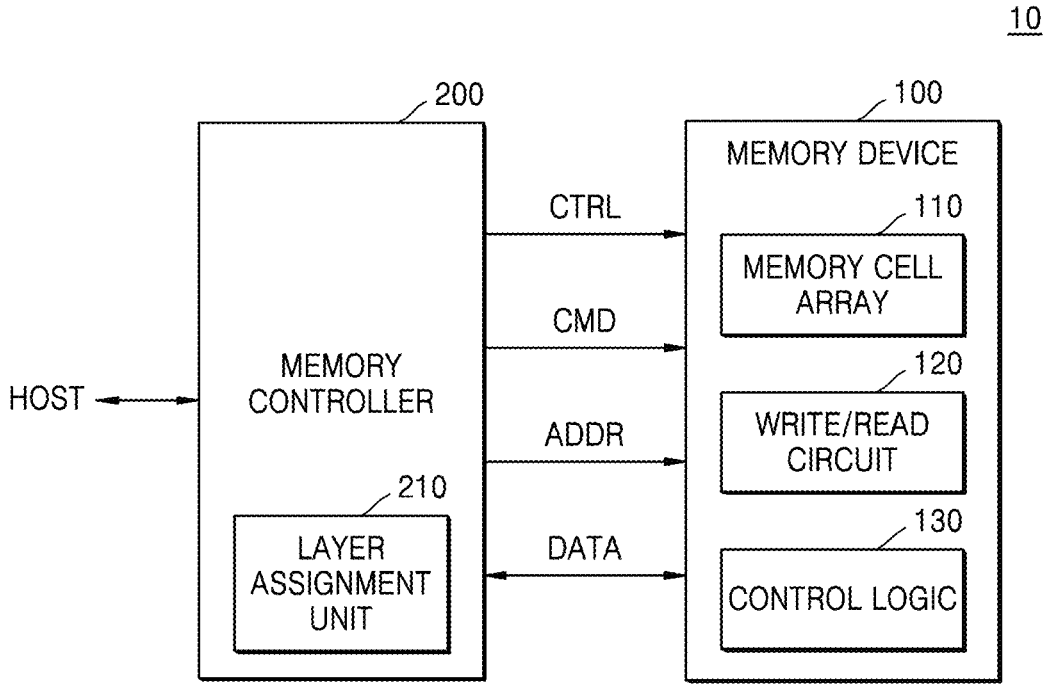
FIG. 1 is a block diagram of a memory system according to an example embodiment.

As used herein, the term "and/or" includes any and all combinations of one or more of the associated listed items. Expressions such as "at least one of," when preceding a list of elements, modify the entire list of elements and do not modify the individual elements of the list.

Example embodiments of the inventive concepts will now be described more fully with reference to the accompanying drawings, in which some example embodiments thereof are shown. However, example embodiments of the inventive concepts are not limited thereto and it will be understood that various changes in form and details may be made therein without departing from the spirit and scope of the following claims. That is, descriptions on particular structures or functions may be presented merely for explaining example embodiments of the present inventive concepts. Throughout the drawings, like reference numerals denote like elements. Sizes of components in the drawings may be exaggerated for convenience of explanation.

Terms used in the present specification are used for explaining specific example embodiments, not for limiting example embodiments of the inventive concepts. Thus, an expression used in a singular form in the present specification also includes the expression in its plural form unless clearly specified otherwise in context. Also, terms such as "include" or "comprise" may be construed to denote a certain characteristic, number, step, operation, constituent element, or a combination thereof, but may not be construed to exclude the existence of or a possibility of addition of one or more other characteristics, numbers, steps, operations, constituent elements, or combinations thereof.

Terms such as "first" and "second" are used herein merely to describe a variety of constituent elements, but the constituent elements are not limited by the terms. Such terms are used only for the purpose of distinguishing one constituent element from another constituent element. For example, without departing from the right scope of the present inventive concept, a first constituent element may be referred to as a second constituent element, and vice versa.

Unless defined otherwise, all terms used herein including technical or scientific terms have the same meanings as those generally understood by those of ordinary skill in the art to which the example embodiments of the inventive concepts may pertain. The terms as those defined in generally used dictionaries are construed to have meanings matching that in the context of related technology and, unless clearly defined otherwise, are not construed to be ideally or excessively formal.

FIG. 1 is a block diagram of a memory system 10 according to an example embodiment. The memory system 10 may include a memory device 100 and a memory controller 200.

In at least some example embodiment, the memory device 100 may include a variety of types of memory cells. For example, in some example embodiments, the memory device 100 may include resistive memory cells, the memory device 100 may be referred to as the resistive memory device. Alternatively, in other example embodiments, the memory device 100 may include a variety of types of memory cells, and as the memory cells are arranged at regions where a plurality of first signal lines and a plurality of second signal lines intersect, the memory device 100 may be referred to as a cross-point memory device. In the following descriptions of some of the example embodiments, the memory device 100 may be the resistive memory device.

Referring to FIG. 1, the memory system 10 may include the memory device 100, and a memory controller 200. The memory device 100 may include a memory cell array 110, a read/write circuit 120, and control logic 130. When the memory cell array 110 includes resistive memory cells, the memory system 10 may be referred to as the resistive memory system.

The memory controller 200, in response to a read/write request from a host HOST, may control the memory device 100 to read data stored in the memory device 100 or write data to the memory device 100. In detail, the memory controller 200 may control program or write, read, and erase operations with respect to the memory device 100 by providing an address ADDR, a command CMD, and a control signal CTRL to the memory device 100. Also, data DATA to be written and data DATA to be read may be communicated between the memory controller 200 and the memory device 100.

The memory cell array 110 may include a plurality of memory cells (not shown) arranged at the regions where the first signal lines and the second signal lines intersect. In some example embodiments, the first signal lines may be a plurality of bit lines and the second signal lines may be a plurality of words lines. In other example embodiments, the first signal lines may be a plurality of word lines and the second signal lines may be a plurality of bit lines.

Also, each of the memory cells may be a single-level cell (SLC) where one bit of data is stored or a multi-level cell (MLC) where at least two bits of data are stored. Alternatively, the memory cell array 110 may include SLC and MLC altogether. When one bit of data is written to one memory cell, the memory cells may have two resistance level distributions according to the written data. Alternatively, when two bits of data are written to one memory cell, the memory cells may have four resistance level distributions according to the written data. In other example embodiments, when three bits of data are written to one memory cell, that is, a triple level cell (TLC), the memory cells may have eight resistance level distributions according to the written data. However, example embodiments of the inventive concepts are not limited thereto. For example, in some example embodiments, the memory cells each may store four or more bits of data.

Also, in at least some example embodiments, the memory cell array 110 may include resistive memory cells included in a plurality of layers. For example, the memory system 10 may include a plurality of layers that are stacked vertically, and at least some of the plurality of layers may include array-type memory cells. That is, memory cells included in the plurality of layers may constitute the memory cell array 100. Also, in some example embodiments, a layer including the memory cell array 110 may be defined as a cell layer, and a layer including the write/read circuit 120 and the control logic 30 as various other peripheral circuits may be defined as a control layer. The control layer may correspond to an additional layer other than the cell layer.

Alternatively, the memory cell array 110 may include resistive memory cells having variable resistance devices (not shown). For example, when the variable resistance device is formed of a phase change material such as germanium-antimony-tellurium (GST or Ge—Sb—Te) and thus resistance changes according to temperature, the resistive memory device may be phase change RAM (PRAM). In another example, when the variable resistance device is formed of an upper electrode, a lower electrode, and a complex metal oxide interposed therebetween, the resistive memory device may be resistive RAM (RRAM). In another example, when the variable resistance device is formed of a magnetic upper electrode, a magnetic lower electrode, and a dielectric material interposed therebetween, the resistive memory device may be magnetic RAM (MRAM).

The read/write circuit 120 performs read and write operations with respect to the memory cells. The read/write circuit 120 may be connected to the memory cells via a plurality of bit lines and may include a write driver to write data to the memory cells and a sense amplifier for sensing resistance components of the memory cells.

The control logic 130 may control an overall operation of the memory device 100 and also may control the read/write circuit 120 to perform memory operations such as writing and reading. In an example, the memory device 100 may include a power generator (not shown) for generating various write voltages and read voltages used for the read and write operations. Levels of the write voltage and the read voltage may be adjusted under the control of the control logic 130. Also, in an example, the memory device 100 may include a reference signal generator (not shown) for generating various reference signals used for a read operation. For example, the reference signal generator may generate a reference current and/or a reference voltage. Levels of the reference current and/or the reference voltage may be adjusted under control of the control logic 130.

In the write operation of the memory device 100, a resistance value of a variable resistor of a memory cell of the memory cell array 110 may increase or decrease according to write data. For example, each of the memory cells of the memory cell array 110 may have a resistance value according to currently stored data and the resistance value may increase or decrease according to data to be written to each memory cell. The above write operation may be classified into a reset write operation and a set write operation. In the resistive memory cell, a set state may have a relatively low resistance value whereas a reset state may have a relatively high resistance value.

In some example embodiments, when write and read operations are performed on data, regions may be defined as units of write and read operations, and one piece of region data may be classified into a plurality of pieces of sub-region data. Also, each of the pieces of sub-region data may be controlled to be assigned to any one of a plurality of layers. In one example, at least one piece of region data accompanying one write command may be provided to the memory system 10, and the memory system 10 may process data in units of regions. Also, according to some example embodiment, each of the pieces of region data may be classified into a plurality of pieces of sub-region data, and at least two sub-region data may be controlled to be written to different layers. To assign sub-region data to any one of the plurality of layers, the memory controller 200 may include a layer assignment unit 210.

According to the above-described embodiment, even if differences in cell characteristics, degree of degradation of distribution and endurance occur among layers, bit error rates (BERs) of a desired (or, alternatively, a predetermined) unit (e.g., a region unit) of data may be uniform.

For example, the memory device 100 may have a difference in degradation of dispersion or degradation of endurance due to a difference in generation of heat among layers of the memory device 100 such that region data written to layers having high dispersion of degradation or endurance may be more likely to cause errors in the region data written thereto. An algorithm for correcting errors may need to be designed based on a layer having a high Bit Error Rate (BER). Conventionally, since respective layers may have different BERs, the algorithm for correcting errors may be complicated or a size of parity data used to correct errors may increase. In other words, resources for ensuring data reliability may increase. However, according to at least some example embodiments, data reliability may increase by uniformizing BERs of region data.

Alternatively, the memory device 100 and the memory controller 200 may be integrated as one semiconductor device. For example, the memory device 100 and the memory controller 200 may be integrated as one semiconductor device, forming a memory card. For example, the memory device 100 and the memory controller 200 that are integrated as one semiconductor device may form a PC card (PCMCIA), a compact flash card (CF), a smart media card (SM/SMC), a memory stick, a multimedia card (MMC, RS-MMC, or MMCmicro), an SD card (SD, miniSD, or microSD), a universal flash memory (UFS), etc. In another example, the memory device 100 and the memory controller 200 may be integrated as one semiconductor device forming a solid state disk/drive (SSD).

Figure 2:
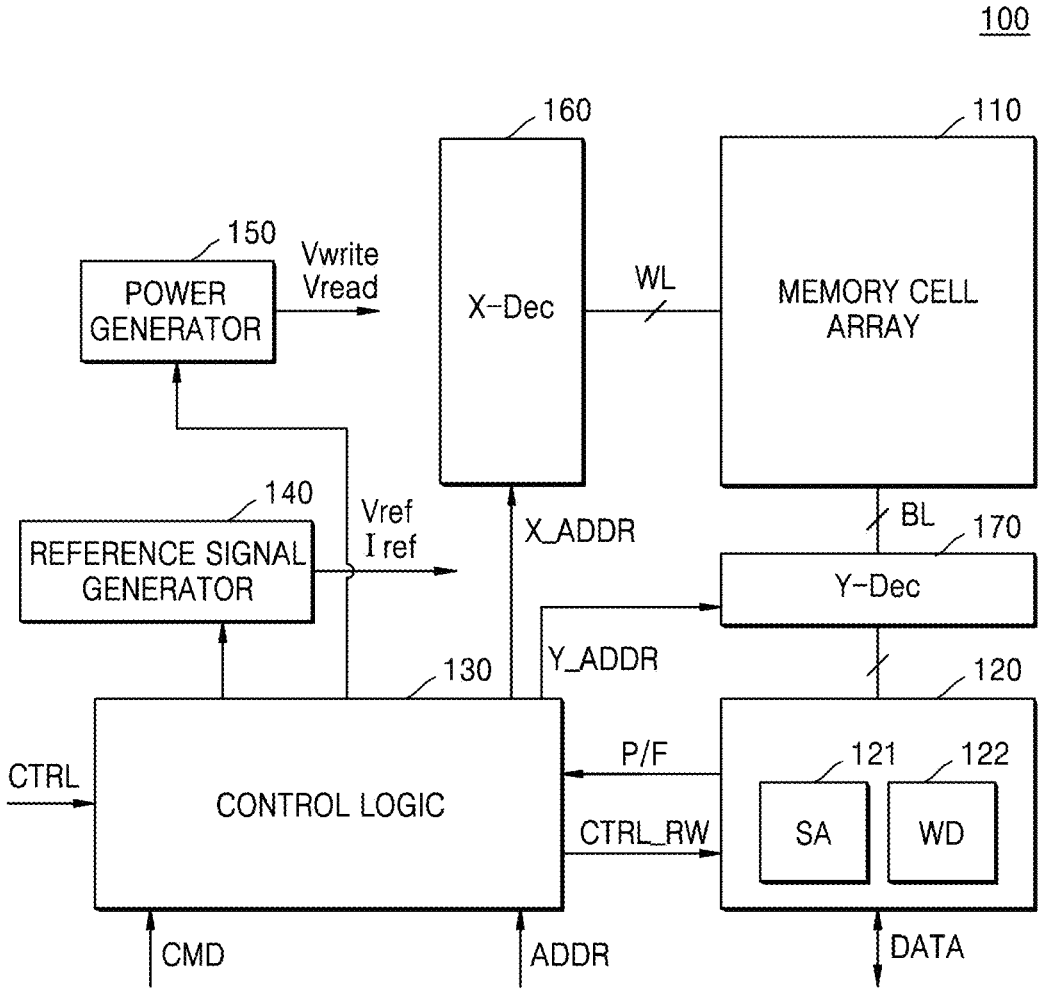
FIG. 2 is a block diagram illustrating an example embodiment of the memory device of FIG. 1.

An example of a detailed operation of the memory device 100 included in the memory system 10 configured as above is shown as follows. FIG. 2 is a block diagram illustrating an example of the memory device 100 of FIG. 1.

Referring to FIG. 2, the memory device 100 may include the memory cell array 110, the read/write circuit 120, and the control logic 130. Also, the memory device 100 may further include a reference signal generator 140, a power generator 150, a row decoder 160, and a column decoder 170. Also, the read/write circuit 120 may include a sense amplifier 121 and a write driver 122.

An example of an operation of the memory device 100 of FIG. 2 is described as follows.

Memory cells provided in the memory cell array 110 may be connected to a plurality of first signal lines and a plurality of second signal lines. The first signal lines may be bit lines BL and the second signal lines may be word lines WL. As various voltage signals or current signals are provided through the bit lines BL and the word lines WL, data may be read from or written to selected memory cells and data reading or writing on the other non-selected memory cells may be prevented.

Alternatively, an address ADDR to indicate a memory cell to access may be received with a command CMD. The address ADDR may include a row address X_ADDR to select the word line WL of the memory cell array 110 and a column address Y_ADDR to select the bit line BL of the memory cell array 110. The row decoder 160 performs a word line selection operation in response to the row address X_ADDR. The column decoder 170 performs a bit line selection operation in response to the column address Y_ADDR. Also, at least one bit of the address ADDR may include layer selection information for selecting at least one layer including a memory cell to be accessed.

The read/write circuit 120 being connected to the bit lines BL may write data to the memory cell or may read data from the memory cell. In some example embodiments, the power generator 150 may generate a write voltage Vwrite used for a write operation, and generate a read voltage Vread used for a read operation. The write voltage Vwrite may include a set voltage and a reset voltage as various voltages related to the write operation. Also, the read voltage Vread may include a bit line voltage, a precharge voltage, and a clamping voltage as various voltages related to the read voltage. The write voltage Vwrite and the read voltage Vread may be provided through the write/read circuit 120 to the bit lines BL or provided through the row decoder 170 to the word lines WL.

Alternatively, the reference signal generator 140 may generate a reference voltage Vref and a reference current Tref as various reference signals related to a data read operation. For example, the sense amplifier 121 may be connected to one node (e.g., a sensing node) of the bit line BL, and a data value may be determined by comparing a voltage of the sensing node with the reference voltage Vref. Alternatively, when a current sensing method is applied, the reference signal generator 150 may generate the reference current Tref and provide the reference current Tref to the memory cell array 110, and the data value may be determined by comparing the voltage of the sensing node due to the reference current Tref with the reference voltage Vref.

Furthermore, the write/read circuit 120 may provide a pass/fail signal P/F to the control logic 130 based on a result of the determination of the read data. The control logic 130 may control write and read operations of the memory cell array 110 referring to the pass/fail signal P/F.

The control logic 130 may output various control signal CTRL_RW to write data to the memory cell array 110 or read data from the memory cell array 110, based on the command CMD, the address ADDR, and the control signal CTRL received from the memory controller 200. Accordingly, the control logic 130 may control various operations in the memory device 100.

According to some example embodiments, pieces of region data may be distributed and written to a plurality of layers according to an address ADDR and data DATA provided to the memory device 100. Alternatively, pieces of region data, which are distributed and written to a plurality of layers, may be read according to an address ADDR provided to the memory device 100. A unit of regions may be variously defined and be, for example, an error correction unit. When the error correction unit is a sector, sector data may be classified into a plurality of pieces of sub-sector data, and the plurality of pieces of sub-sector data may be distributed and written to a plurality of layers.

Due to the above-described operation, since an error correction unit of data is distributed and written to a plurality of layers, bit error rates (BERs) of the error correction unit of data may be uniformized. Thus, even if some of the plurality of layers are relatively greatly degraded, a possibility of increasing BERs of a specific error correction unit of data or causing uncorrectable errors may be reduced.

An example of a detailed operation of the memory controller 200 included in the resistive memory system 10 is shown as follows.

Figure 3:
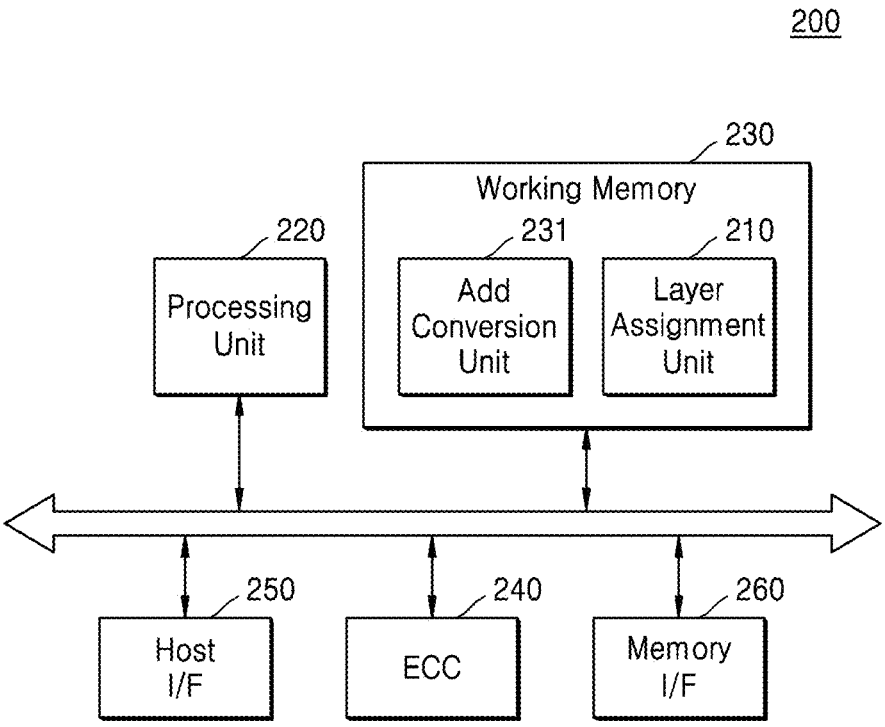
FIG. 3 is a block diagram illustrating an example embodiment of a memory controller of FIG. 1.

FIG. 3 is a block diagram illustrating an example of the memory controller 200 of FIG. 1.

Referring to FIG. 3, the memory controller 200 may include a processing unit 220, a working memory 230, an error correction code (ECC) unit 240, a host interface 250, and a memory interface 260. Also, the working memory 230 may include an address conversion unit 231 and a layer assignment unit 210. Although not illustrated in FIG. 3, the memory controller 200 may further include various other components, for example, a read-only memory (ROM) configured to store code data required for an initial booting operation of a device adopting the memory system 10 or a buffer memory controller configured to control a buffer memory device.

The processing unit 220 may include a central processing unit (CPU) or a microprocessor (MP), and control an overall operation of the memory controller 200. The processing unit 220 may be referred to as a processor. The processor may be a central processing unit (CPU), a controller, or an application-specific integrated circuit (ASIC), that, when executing instructions stored in the memory, configures the processor as a special purpose computer configured to uniformly distribute the sector data among a plurality of layers such that the bit error rate (BER) among the sector data is more uniform. Therefore, the memory system 10 including the processor may improve the functioning of the memory system 10 itself by reducing the amount of resources (bits) used to successfully perform error correction.

The processing unit 220 may be configured to drive firmware for controlling the memory controller 200, and the firmware may be loaded in the working memory 230 and driven. The memory controller 200 may communicate with an external host via various standard interfaces, and the host interface 250 may provide this standard interface between the external host and the memory controller 200. The standard interface may include various interface protocols, such as advanced technology attachment (ATA), serial ATA (SATA), external SATA (e-SATA), a small computer small interface (SCSI), serial attached SCSI (SAS), peripheral component interconnection (PCI), PCI express (PCI-E), IEEE 1394, a universal serial bus (USB), a secure digital (SD) card, a multimedia card (MMC), an embedded multimedia card (eMMC), and a compact flash (CF) card.

The memory interface 260 may provide an interface between the memory controller 200 and the memory device 100. For example, the memory interface 260 may transmit and receive write data and read data through the memory interface 260 to and from the memory device 100. Also, the memory interface 260 may further provide an interface between the memory controller 200 and a buffer memory device (not shown).

The ECC unit 240 may perform an ECC encoding operation to generate parity data based on the write data, and perform an ECC decoding operation to detect and correct errors in the read data. The ECC unit 240 may perform the ECC encoding and decoding operations on a desired (or, alternatively, a predetermined) unit of data. For example, as described above, sector data may be defined as a unit of ECC encoding and decoding operations. Although FIG. 3 illustrates the ECC unit 240 as a component of the memory controller 200, the ECC unit 240 may be included in the memory device 100.

The firmware driven by the processing unit 220 to control the memory controller 200 and meta data required to drive the firmware may be stored in the working memory 230. The working memory 230 may be embodied by various memory devices, for example, at least one of a cache memory, a dynamic random access memory (DRAM), a static RAM (SRAM), a phase-change RAM (PRAM), and a flash memory device. However, example embodiments are not limited thereto. For example, the working memory 230 may be any volatile memory, such as a static RAM (SRAM), a dynamic RAM (DRAM), or a synchronous DRAM (SDRAM).

When executing the firmware, the processing unit 220 may be configured to perform the functions of various functional blocks. For example, the firmware in the working memory 230 may, when executed by the processing unit 220, configures the processing unit 220, to delineate the working memory 230 as an address conversion unit 231 and the layer assignment unit 210. The address conversion unit 231 may store an address (e.g., a physical address) indicating a physical position of a memory cell to be actually accessed based on an address conversion operation. When the host accesses the memory system 10, the host may provide a logical address to the memory controller 200. The address conversion unit 231 may include a mapping table (not shown) configured to store information regarding a mapping relationship between the logical address and the physical address, and the processing unit 220 may convert the logical address from the host into the physical address using the address conversion unit 231.

Alternatively, in some example embodiments, the processing unit 220 may perform a layer assignment operation using the layer assignment unit 210. The layer assignment operation may include assigning each of a plurality of pieces of sub-region data included in one region to any one of a plurality of layers. For example, when a physical address indicating a position of a region to be actually accessed is generated due to an address conversion operation, the processing unit 220 may perform the layer assignment operation based on the generated physical address to generate an assignment result, and select a layer in which each of the pieces of sub-region data is to be accessed based on the assignment result.

The layer assignment unit 210 may include a mapping table (not shown) configured to store information regarding a mapping relationship between a physical address in one region into a physical address of a plurality of sub-regions.

According to the layer assignment operation, the processing unit 220 may convert a physical address (e.g., a first address) indicating a physical position of any one region into a physical address (e.g., a second address) indicating physical positions of a plurality of sub-regions. The second address may include layer selection information indicating a position of a layer assigned to each of the pieces of sub-region data.

While FIG. 3 illustrates that the address conversion unit 231 and the layer assignment unit 210 are different function blocks, example embodiments of the inventive concepts are not limited thereto. For example, in other example embodiments, the address conversion unit 231 and the layer assignment unit 210 may be defined as the same functional block.

Figure 4A:
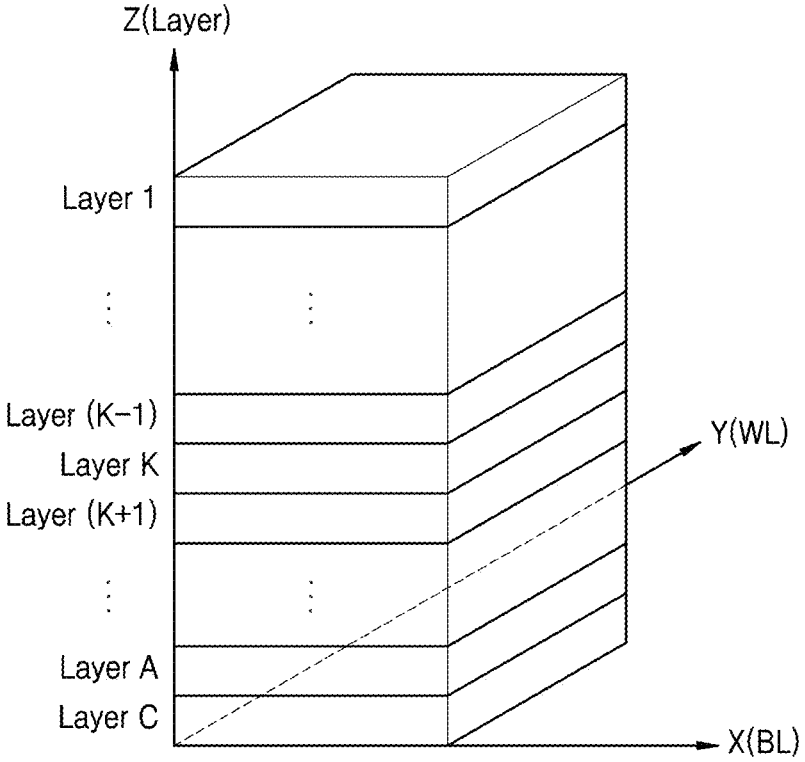
FIGS. 4A and 4B are respectively a configuration diagram and circuit diagram illustrating an example embodiment of a memory device.
Figure 4B:
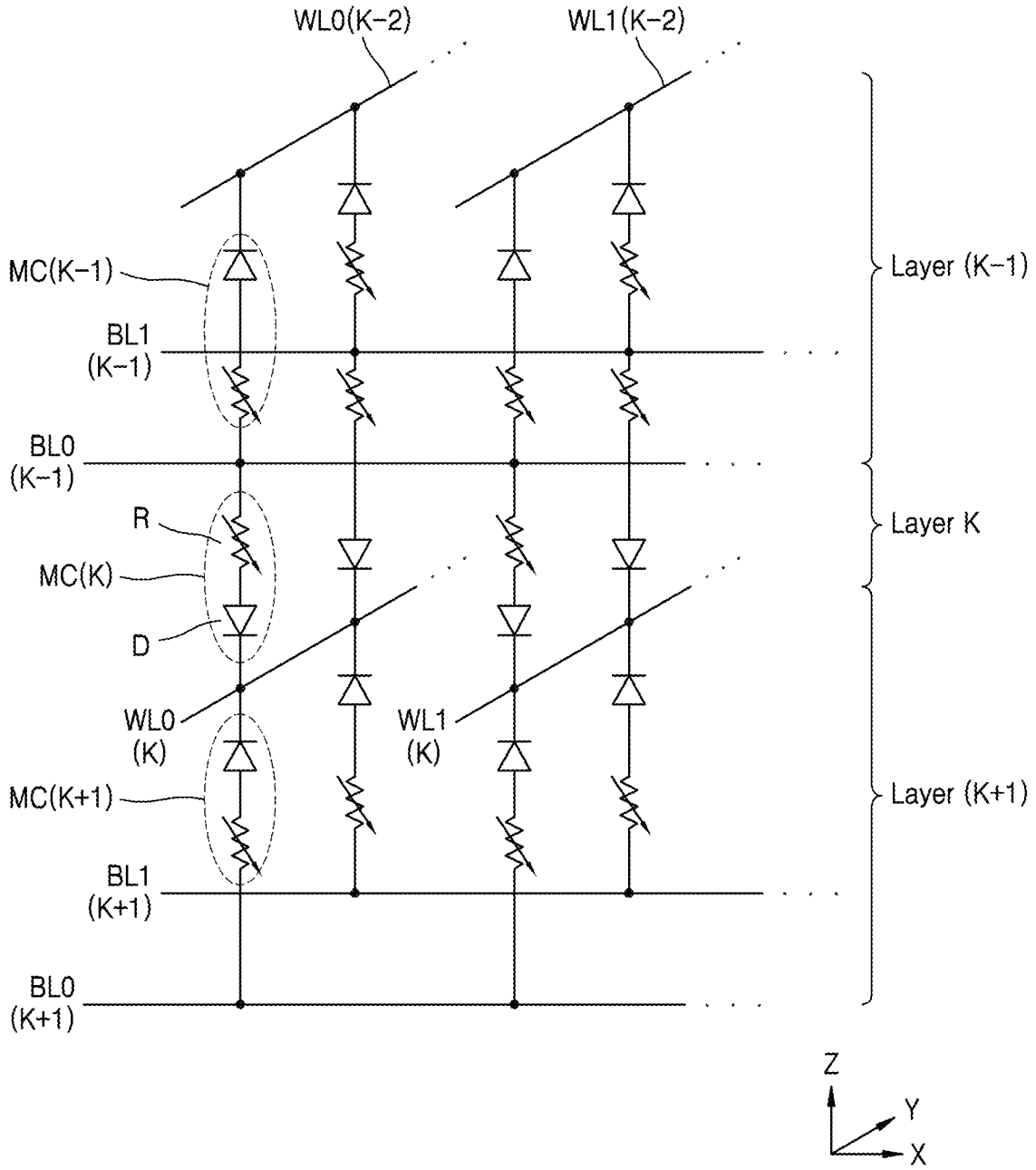

FIGS. 4A and 4B are respectively a configuration diagram and circuit diagram illustrating an example embodiment of a memory device 100.

Referring to FIG. 4A, the memory device 100 may have a 3-dimensional structure and be configured by stacking layers on an X-Y plane in a Z-axial direction. In some example embodiment, a lowermost layer Layer C and a plurality of layers, for example, A layers Layer 1 to Layer A, which are vertically stacked on the lowermost layer Layer C, are illustrated, and it is assumed that a first layer Layer 1 is an uppermost layer. An X-axis may be a direction in which bit lines BL are arranged, a Y-axis may be a direction in which word lines WL are arranged, and a Z-axis may be a direction in which the layers Layer C and Layer 1 to Layer A are stacked.

At least some of the layers Layer C and Layer 1 to Layer A may be cell layers including memory cells. For example, each of the first to A-th layers Layer 1 to Layer A may include memory cells. Also, various peripheral circuits configured to perform write and read operations on memory cells may be disposed in an additional layer. For example, the lowermost layer Layer C may correspond to a control layer including at least one peripheral circuit. At least one component of the memory device 100 shown in FIG. 2 may be included in the control layer Layer C.

FIG. 4B illustrates an example embodiment of some of the layers shown in FIG. 4A.

Referring to FIG. 4B, each of layers Layer K−1, Layer K, and Layer K+1 may include a plurality of memory cells MC(K−1), MC(K), and MC(K+1), and word lines WL0 and WL1 and bit lines BL0 and BL1 may be connected to two ends of the memory cells MC(K−1), MC(K), and MC(K+1).

In some example embodiments, word lines and/or bit lines may be shared between adjacent layers. For example, word lines WL0(K) and WL1(K) may be shared between a K-th layer Layer K and a K+1-th layer Layer (K+1). Also, bit lines BL0(K−1) and BL1(K−1) may be shared between the K-th layer Layer K and a K−1-th layer Layer (K−1). FIG. 4B illustrates an example in which bit lines or word lines are shared between layers, and one layer shares word lines or bit lines with both layers disposed above and below the corresponding layer, but example embodiments of the inventive concepts are not limited thereto. In another example, any one layer may share word lines or bit lines with a layer disposed adjacent thereto. Alternatively, any one layer may share word lines or bit lines with a layer disposed apart from the corresponding layer.

As shown in FIG. 4B, memory cells of adjacent layers may have a mirrored-interconnect structure and have a symmetric structure including mirrored resistance devices and selective devices. However, example embodiments are not limited thereto. For example, while FIG. 4B illustrates a symmetric structure, in other example embodiments, the memory cells of the adjacent layers may have a mirrored-interconnect structure but have an asymmetric structure because resistive devices and selective devices are stacked in the same order. Thus, differences in current amount may occur among the layers, so that the layers may have different reliabilities or different BERs.

Figure 5:
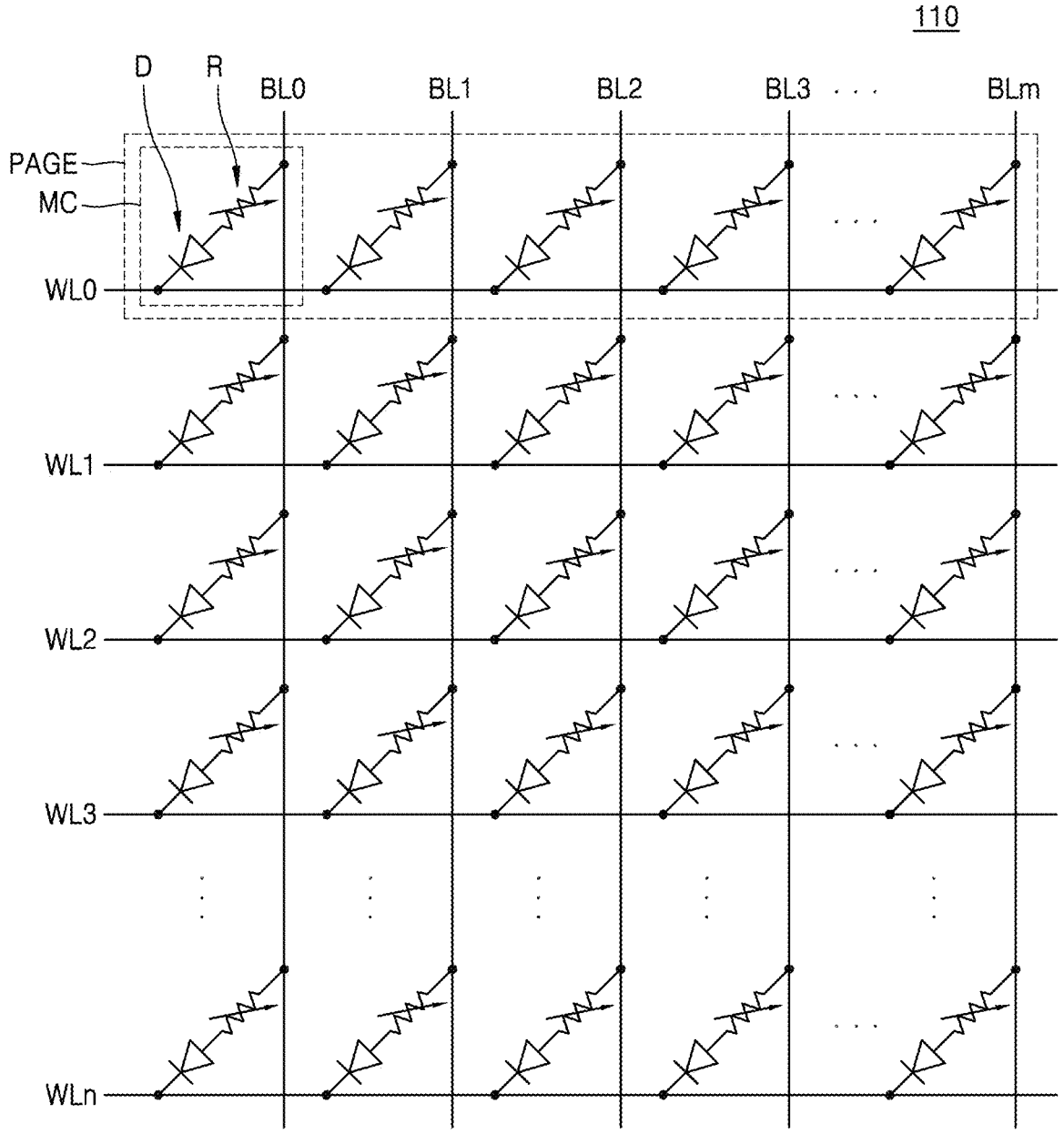
FIG. 5 is a circuit diagram illustrating an example embodiment of a memory cell array of FIG. 2.

FIG. 5 is a circuit diagram illustrating an example embodiment of a memory cell array 110 of FIG. 2. The memory cell array 110 of FIG. 5 may include memory cells formed in one layer.

Referring to FIG. 5, the memory cell array 110 may include a plurality of word lines WL0 to WLn, a plurality of bit lines BL0 to BLm, and a plurality of memory cells MC. The number of the word lines WL, the number of the bit lines BL, and the number of the memory cells MC may be variously changed according to example embodiments. Also, the memory cells MC connected to the same word line WL may be defined for each page. As described in the following example embodiments, the memory cell array 110 may include a plurality of tiles, and memory cells included in a plurality of tiles may be included in one page.

Each of the memory cells MC may include a variable resistor R and a selective device D. The variable resistor R may be referred to as a variable resistance device or a variable resistor material, and the selective device D may be referred to as a switching device.

In some example embodiments, the variable resistor R may be connected between one of the bit lines BL0-BLm and the selective device D. The selective device D may be connected between the variable resistor R and one of the word lines WL0-WLn. However, example embodiments of the inventive concepts are not limited thereto, and the selective device D may be connected between one of the bit lines BL0-BLm and the variable resistor R, and the variable resistor R may be connected between the selective device D and one of the word lines WL0-WLn.

The variable resistor R may vary into one of a plurality of resistance states by an applied electric pulse. In some example embodiments, the variable resistor R may include a phase-change material having a crystal state that changes according to an amount of current. The phase-change material may include two-element compounds such as GaSb, InSb, InSe, $Sb_2Te_3$, and GeTe, three-element compounds such as GeSbTe, GaSeTe, InSbTe, $SnSb_2Te_4$, and InSbGe, four-element compounds such as AgInSbTe, (GeSn)SbTe, GeSb(SeTe), and $Te_{81}Ge_{15}Sb_2S_2$, etc. However, example embodiments are not limited thereto.

The phase-change material may have an amorphous state having a relatively high resistance and a crystal state having a relatively low resistance. The phase-change material may have a phase that changes according to Joule's heat generated according to an amount of current. Accordingly, data may be written by using the phase change.

Alternatively, in other example embodiments, the variable resistor R may include, instead of the phase-change material, perovskite compounds, transition metal oxides, magnetic materials, ferromagnetic materials, or antiferromagnetic materials. When the variable resistor R includes a transparent metal oxide (TMO), generation of oxygen vacancy in the TMO may be determined according to a voltage applied to two electrodes of the TMO. An amount of current flowing through the TMO may be determined according to an amount and type of oxygen vacancy generated in the TMO. Thus, a resistance of the memory cell MC may be determined, and data may be written according to a variation in the resistance of the memory cell MC.

The selective device D may be connected between one of the word lines WL0-WLn and the variable resistor R and may control supply of current to the variable resistor R according to the voltage applied to the connected word line and bit line. In some example embodiments, the selective device D may be a PN junction diode or a PIN junction diode. An anode of the diode may be connected to the variable resistor R and a cathode of the diode may be connected to one of the word lines WL0-WLn. When a voltage difference between the anode and the cathode of the diode is higher than a critical voltage of the diode, the diode may be turned on so as to supply current to the variable resistor R.

According to example embodiments, a region and a sub-region may be variously defined as units for performing a layer assignment operation. For example, a page PAGE shown in FIG. 5 may be defined as the region. In this case, the page PAGE may be classified into a plurality of sub-pages Sub-page, and each of the sub-pages Sub-page may be defined as a sub-region. Thus, a layer assignment operation may be performed on each piece of sub-page data. Also, the page PAGE may include a plurality of sectors, and each of the sectors may be defined as a sub-region. Thus, a layer assignment operation may be performed on each piece of sector data.

Alternatively, each of the sectors may include a plurality of sub-sectors, and each of the sub-sectors may be defined as a sub-region. Thus, a layer assignment operation may be performed on each piece of sub-sector data.

Figure 6A:
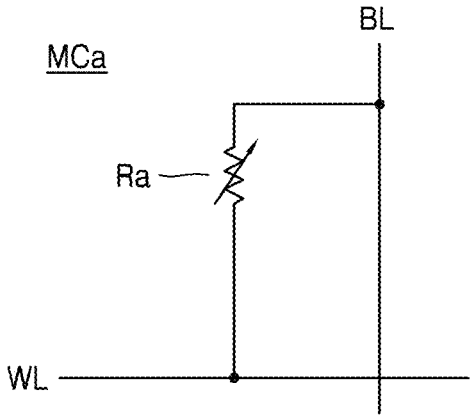
FIGS. 6A to 6C are circuit diagrams illustrating modified examples of the memory cell of FIG. 5.
Figure 6B:
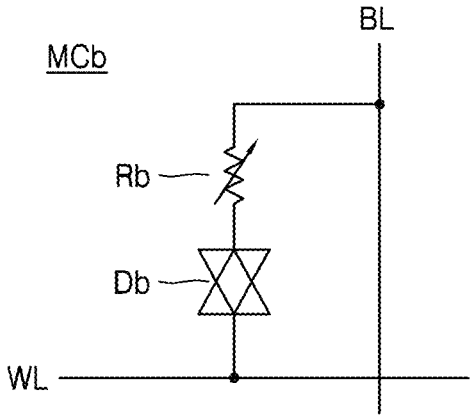
Figure 6C:
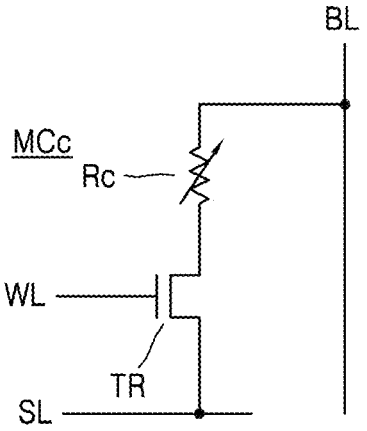

FIGS. 6A to 6C are circuit diagrams illustrating modified examples of the memory cell MC of FIG. 5.

Referring to FIG. 6A, a memory cell MCa may include a variable resistor Ra. The variable resistor Ra may be connected between a bit line BL and a word line WL. The memory cell MCa may store data by the voltages applied to each of the bit line BL and the word line WL.

Referring to FIG. 6B, a memory cell MCb may include a variable resistor Rb and a bidirectional diode Db. The variable resistor Rb may include a resistive material for storing data. The bidirectional diode Db may be connected between the variable resistor Rb and the word line WL, and the variable resistor Rb may be connected between the bit line BL and the bidirectional diode Db. The positions of the bidirectional diode Db and the variable resistor Rb may be switched with each other. The bidirectional diode Db may block a leakage current flowing through a non-selective resistance cell.

Referring to FIG. 6C, a memory cell MCc may include a variable resistor Rc and a transistor TR. The transistor TR may be a selective device, that is, a switching device, that permits or blocks supply of current to the variable resistor Rc according to the voltage of the word line WL. In some example embodiments, in addition to the word line WL illustrated in FIG. 4C, the memory cell array 110 may include a source line SL to adjust voltage levels at the opposite ends of the variable resistor Rc. The transistor TR may be connected between the variable resistor Rc and the source line SL, and the variable resistor R may be connected between the bit line BL and the transistor TR. The positions of the transistor TR and the variable resistor Rc may be switched with each other. The memory cell MCc may be selected or may not be selected according to turning on or off of the transistor TR that is driven by the word line WL.

Figure 7:
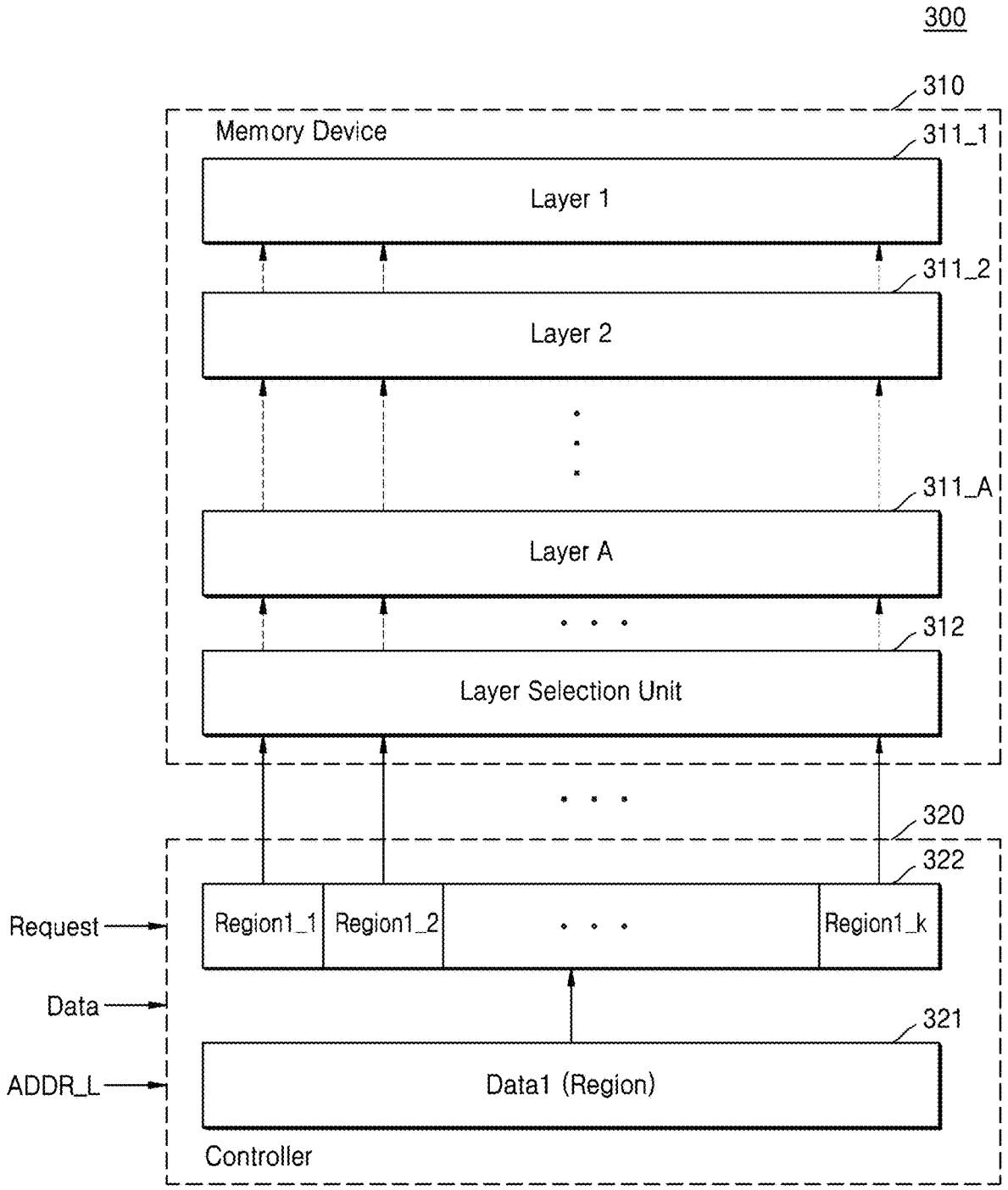
FIG. 7 is a block diagram of a memory system performing a memory operation according to an example embodiment.

FIG. 7 is a block diagram of a memory operation of a memory system 300 according to an example embodiment.

As shown in FIG. 7, the memory system 300 may include a memory device 310 and a memory controller 320. In FIG. 7, a data write operation is illustrated as the memory operation. However, example embodiments are not limited thereto.

The memory controller 320 may control the memory device 310 to perform a memory operation according to a request from a host (not shown). The memory controller 320 may receive write data Data, and receive a logical address ADDR_L indicating a logical position in which the write data Data is to be stored. The memory controller 320 may include an input buffer 321 and an output buffer 322. A size of write data Data provided by the host may be the same as or different from a size of data (e.g., a region unit of data) processed by the memory controller 320. For example, when the write data Data includes a plurality of pieces of region data, the plurality of pieces of region data may be stored in a storage unit (not shown) of the memory controller 320, and a processing operation may be performed on each unit of region data. In FIG. 7, region data Data1 stored in the input buffer 321 may correspond to part of the write data Data received from the host.

Region data (e.g., first region data Data1) may be classified into a plurality of pieces of sub-region data. For example, the first region data Data1 may be classified into k sub-region data Region1_1 to Region1_k. Also, according to a layer assignment operation of the memory controller 320, each of k pieces of sub-region data Region1_1 to Region1_k may be assigned to any one of a plurality of layers Layer 1 to Layer A and 311_1 to 311_A included in the memory device 310. The k sub-region data Region1_1 to Region1_k may be provided through the output buffer 322 to the memory device 310. A layer selection unit 312 may selectively provide each of the k pieces of sub-region data Region1_1 to Region1_k to any one of a plurality of layers 311_1 to 311_A based on an assignment result from the memory controller 320.

According to the above-described operation, one piece of region data Data1 may be distributed and written to at least two layers. The sub-region data Region1_1 to Region1_k may be assigned according to various rules in consideration of the number of sub-region data Region1_1 to Region1_k and the number of layers. For example, all the sub-region data Region1_1 to Region1_k may be written to different layers. Alternatively, at least two layers may be selected, and the sub-region data Region1_1 to Region1_k may be controlled to be written to the at least two selected layers.

Data Data accompanying one request Request may include a plurality of pieces of region data. After assignment and write operations are performed on any one piece of region data, a write operation may be performed on another piece of region data. For example, after a write operation on the first region data Data1 is finished, the controller 320 may perform a layer assignment operation on second region data Data2 according to the various rules. Thus, the second region data Data2 may be distributed in at least two layers.

Figure 8A:
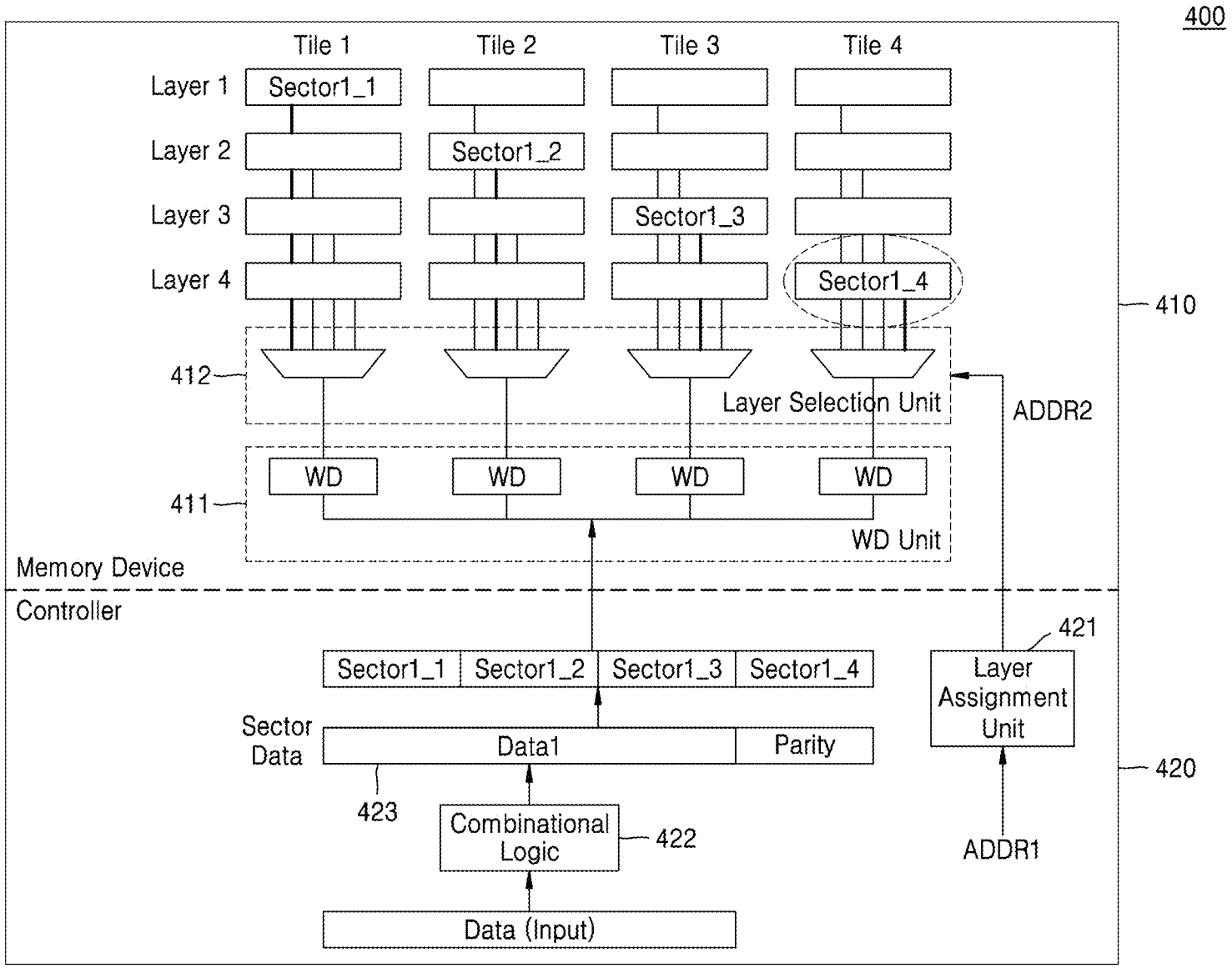
FIGS. 8A and 8B are block diagrams of a memory operation of a memory system 400 according to another example embodiment.
Figure 8B:
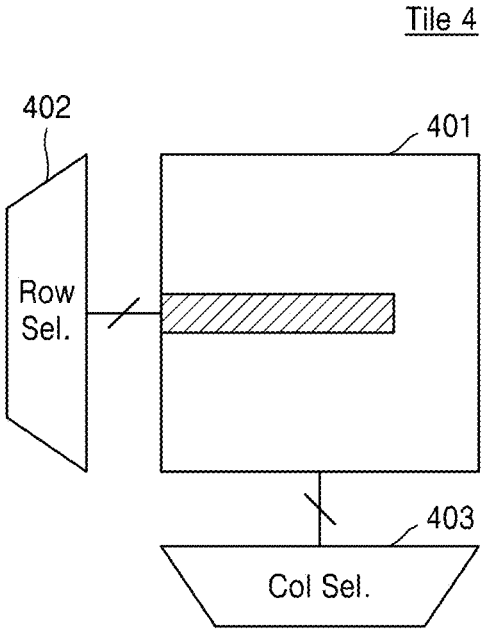

FIGS. 8A and 8B are block diagrams of a memory operation of a memory system 400 according to other example embodiments.

As shown in FIG. 8A, the memory system 400 may include a memory device 410 and a memory controller 420. In FIG. 8A, first to fourth layers Layer 1 to Layer 4 are illustrated as layers included in the memory device 410. Also, the layers Layer 1 to Layer 4 may include a plurality of tiles, for example, first to fourth ties Tile1 to Tile 4.

A tile Tile may be defined in various manners. For example, the same row selection unit and column selection unit may be shared among signal lines connected to memory cells included in one tile Tile. Also, a write driver and a sense amplifier may be disposed to correspond to a tile Tile so that data may be simultaneously written to or read from memory cells included in different tiles Tile. Also, a tile Tile may be defined as including a row selection unit and a column selection unit in addition to memory cells.

A write operation will now be described as an example. The memory controller 420 may control the memory device 410 to perform a memory operation according to a request from a host (not shown). While FIG. 8A illustrates the write operation as the memory operation, example embodiments are not limited thereto.

The memory controller 420 may receive data (e.g., input data Input) from the host, and generate region data from the data. To generate the region data, a signal processing operation may be performed on the input data Input. For example, a combinational logic 422 may perform a signal processing operation on the input data Input and generate region data. The combinational logic 422 may be one of various types of processing logics, for example, correspond to at least one of an ECC unit, a data modulator, a randomizer, a compression engine, and other processing encoder circuits.

Assuming that the combinational logic 422 is an ECC unit, parity data 'parity' may be generated by performing an ECC encoding operation on the input data Input. Also, data Data1 corresponding to at least part of the input data Input and parity data 'parity' may be defined as one piece of region data. For example, the region data may be sector data Sector Data. The sector data Sector Data may be classified into a plurality of pieces of sub-sector data, for example, four sub-sector data sector1_1 to sector1_4, and provided to the memory device 410. Although it is described above that an output from the combinational logic 422 is region data, the input data Input may include a plurality of pieces of region data, and one of the plurality of pieces of region data may correspond to the region data. In this case, sub-region data may be defined as including part of region data from the host and at least one parity.

The memory controller 420 may include a layer assignment unit 421. The layer assignment unit 421 may perform a layer assignment operation on each of the pieces of sub-sector data sector1_1 to sector1_4. The layer assignment unit 421 may receive a first address ADDR1, and output a second address ADDR2 based on a result of the layer assignment operation. The sub-sector data sector1_1 to sector1_4 may be provided through an output buffer to a write driver WD of the memory device 410, and the second address ADDR2 may be provided to a layer selection unit 412 of the memory device 410.

A write driver unit 411 may include a plurality of write drivers WD, for example, a plurality of write drivers WD corresponding to a plurality of tiles Tile1 to Tile 4. Also, the layer selection unit 412 may include a multiplexer configured to select a transmission path of each of the pieces of sub-sector data. For example, the layer selection unit 412 may include a plurality of multiplexers corresponding to the plurality of tiles Tile1 to Tile 4. The second address ADDR2 may include layer selection information for controlling each of the plurality of multiplexers included in the layer selection unit 412.

According to some example embodiments, one piece of sector data Sector Data may be distributed and written to a plurality of layers. For example, first sub-sector data sector1_1 may be written to a first tile Tile1 of a first layer Layer 1, second sub-sector data sector1_2 may be written to a second tile Tile 2 of a second layer Layer 2, third sub-sector data sector1_3 may be written to a third tile Tile 3 of a third layer Layer 3, and fourth sub-sector data sector1_4 may be written to a fourth tile Tile 4 of a fourth layer Layer 4. However, example embodiments of the inventive concepts are not limited to the above-described example of the write operation, and the sector data may be distributed and written to at least two layers in various manners.

According to the above-described example embodiment, a selection unit for selecting a layer may be disposed in each storage space (e.g., tiles) of a memory device 410, so that a layer for writing sub-sector data may be freely selected in each tile. Also, since sector data is distributed and written to a plurality of layers, bit error rates (BERs) of respective sector data may be uniformized, and, therefore, there may be an increased probability of successfully performing an error correction operation.

Referring to FIG. 8B, any one tile (e.g., the fourth tile Tile 4) may include a cell region 401 in which data is written, a row selection unit 402 for selecting a row of the cell region 401, and a column selection unit 403 for selecting a column of the cell region 402. The second address ADDR2 may include selection information for selecting a layer assigned to each piece of sub-sector data, and further include row/column selection information for selecting a row and a column in each tile. Also, when one piece of sub-sector data is written to a tile, all or some of memory cells arranged in one row may be selected. Alternatively, memory cells arranged in at least two rows may be selected from one tile.

FIGS. 9 to 12 are block diagrams of various examples of a layer assignment operation according to an example embodiment.

Figure 9:
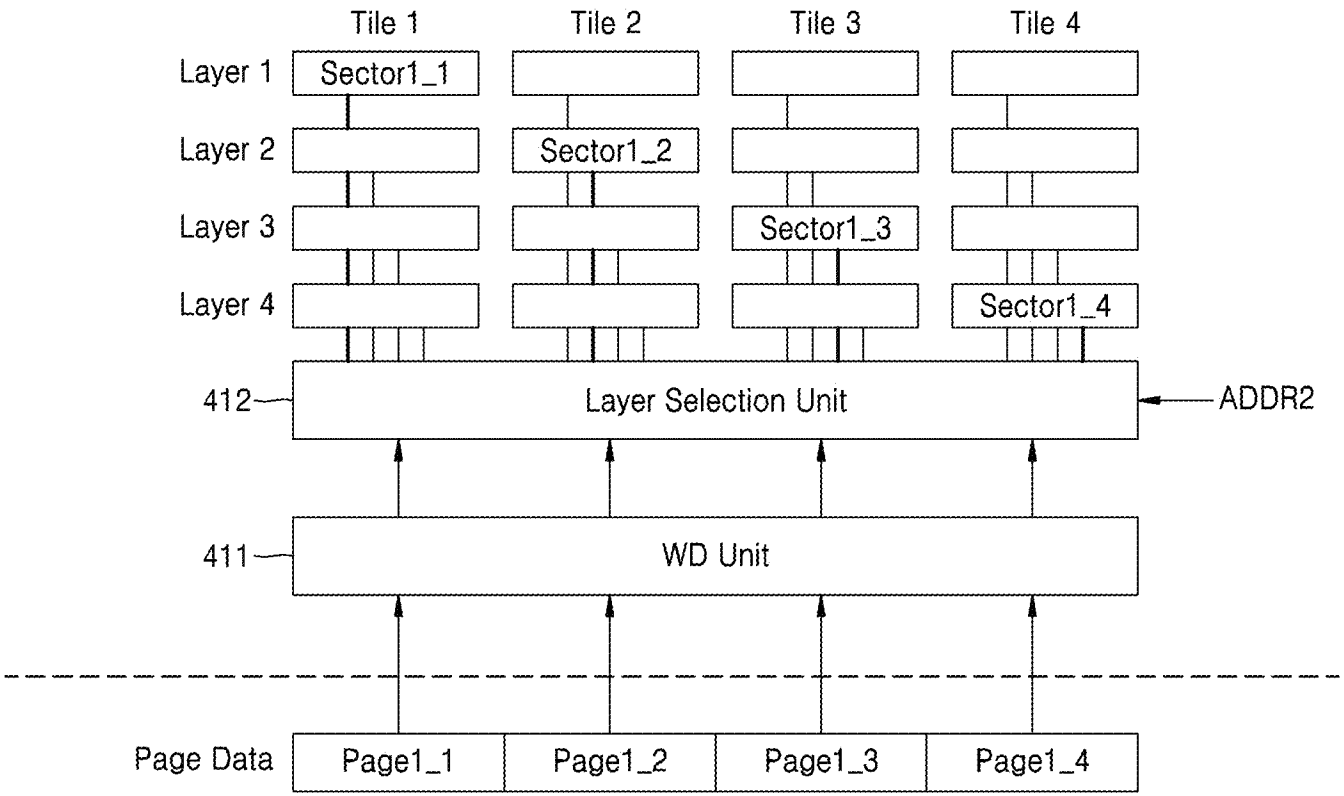
FIGS. 9 to 12 are block diagrams of various examples of a layer assignment operation according to an example embodiment.

Referring to FIG. 9, in the example embodiment shown in FIG. 9, a page is illustrated as a data processing unit. The page may be classified into a plurality of sub-pages. For example, one piece of page data Page Data may be classified into first to fourth sub-page data Page1_1 to Page1_4, which may be provided through the write driver unit 411 of the memory device 410 to the layer selection unit 412. Also, the second address ADDR2 according to the layer assignment operation of the memory controller 420 may be provided to the layer selection unit 412.

The first to fourth sub-page data Page1_1 to Page1_4 may be provided to the tiles Tile1 to Tile 4 of the plurality of layers Layer 1 to Layer 4 included in the memory device 410. In FIG. 9, for example, first sub-page data Page1_1 may be written to a first tile Tile1 of the first layer Layer 1, the second sub-page data Page1_2 may be written to a second tile Tile 2 of the second layer Layer 2, the third sub-page data Page1_3 may be written to a third tile Tile 3 of the third layer Layer 3, and the fourth sub-page data Page1_4 may be written to a fourth tile Tile 4 of the fourth layer Layer 4. However, example embodiments of the inventive concepts are not limited to the above-described example of the write operation, and the page data may be distributed and written to at least two layers in various manners. While FIG. 9 illustrates an example in which one piece of page data Page1 is written, other page data may be sequentially distributed and written to a plurality of layers.

Figure 10:
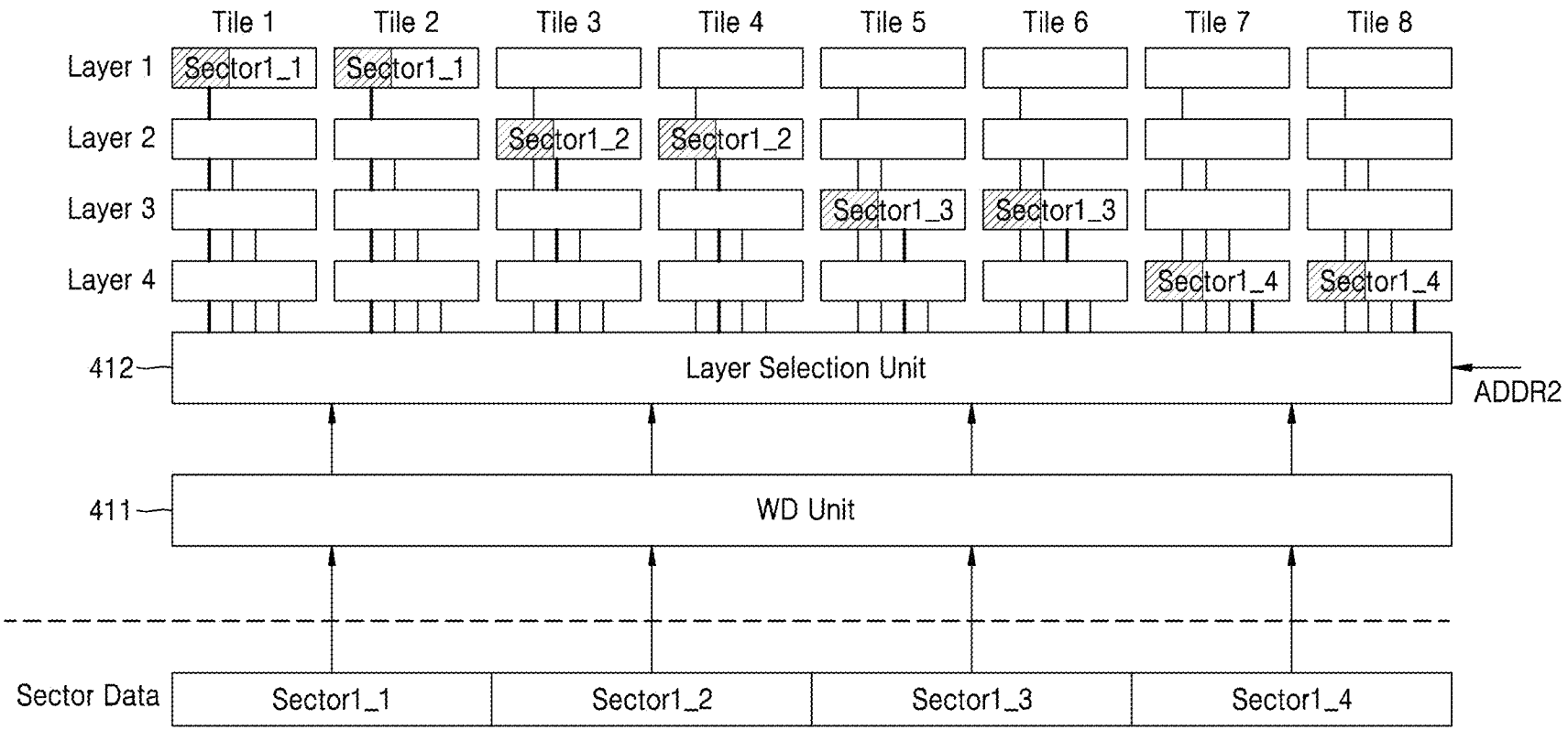

Referring to FIG. 10, in the example embodiment of FIG. 10, a sector is illustrated as an example of a data processing unit. The sector may be classified into a plurality of sub-sectors. For example, one piece of sector data Sector Data may be classified into first to fourth sub-sector data Sector1_1 to Sector1_4, which may be provided through the write driver unit 411 of the memory device 410 to the layer selection unit 412. The address ADDR2 according to the layer assignment operation of the memory controller 420 may be provided to the layer selection unit 412. Also, in some example embodiments, first to fourth layers Layer 1 to Layer 4 are illustrated as a plurality of layers, and first to eighth tiles Tile1 to Tile 8 are illustrated as a plurality of tiles.

A write unit of a resistive memory device may be variously set and, for example, have a smaller size than a sector that is an error correction unit or a data processing unit of the memory controller 420. Also, the resistive memory device may simultaneously write data in a plurality of tiles. Thus, data written to each of the tiles may have a smaller size than the write unit of the resistive memory device.

Each of the first to fourth sub-sector data Sector1_1 to Sector1_4 may be written to at least two tiles of the same layer. For example, the first sub-sector data Sector1_1 may be written to the first and second tiles Tile1 and Tile 2 of the first layer Layer 1, the second sub-sector data Sector1_2 may be written to the third and fourth tiles Tile 3 and Tile 4 of the second layer Layer 2, the third sub-sector data Sector1_3 may be written to fifth and sixth tiles Tile 5 and Tile 6 of the third layer Layer 3, and the fourth sub-sector data Sector1_4 may be written to the seventh and eighth tiles Tile 7 and Tile 8 of the fourth layer Layer 4. However, example embodiments of the inventive concepts are not limited to the above-described example of the write operation, and the sector data may be distributed and written to at least two layers in various manners.

Furthermore, for example, an operation of distributing and writing one piece of sub-sector data to at least two tiles may be performed simultaneously or sequentially. Also, one piece of sub-sector data may not be wholly written at one time in consideration of the write unit of the resistive memory device. In this case, after part of one piece of sub-sector data may be written to at least two tiles, the remaining part thereof may be then written to the at least two tiles.

Figure 11:
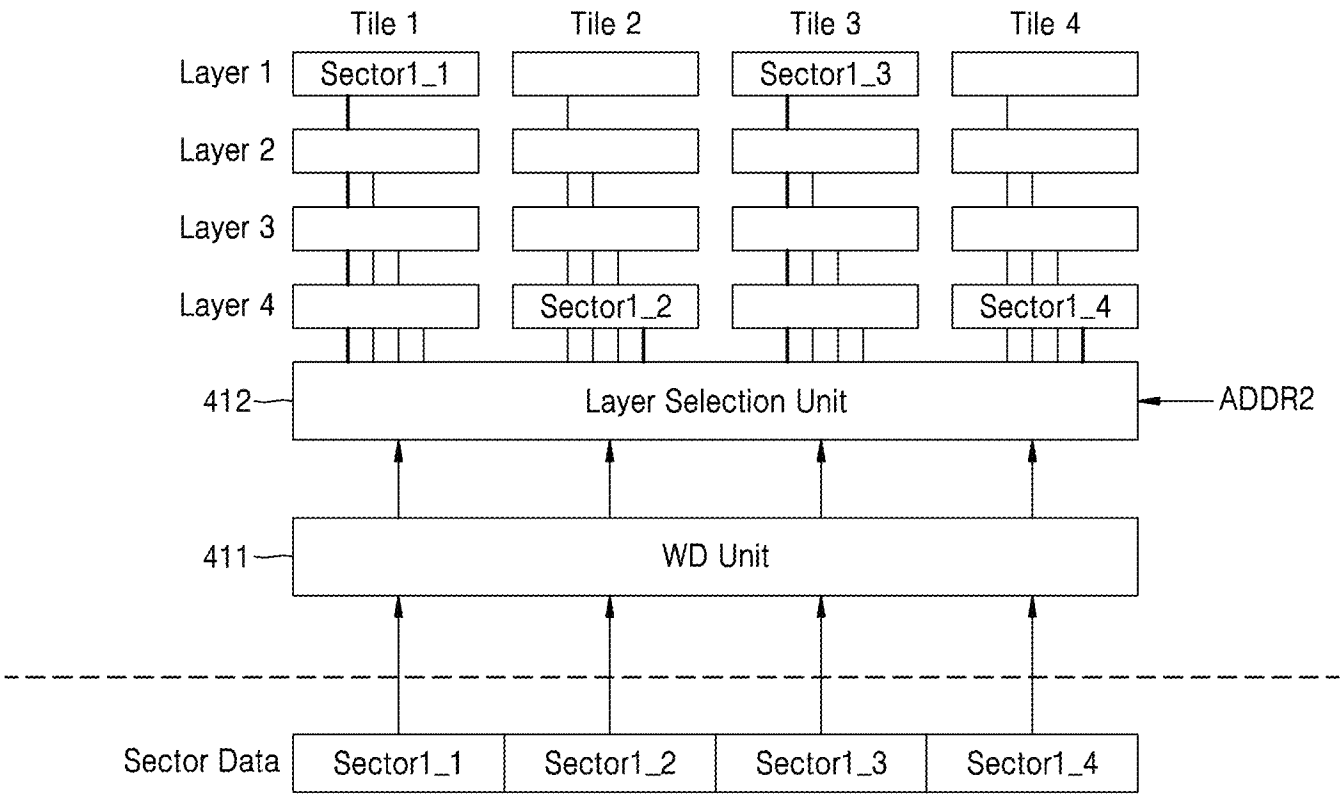

Referring to FIG. 11, FIG. 11 illustrates an example at least two sub-sector data are written to the same layer, and one piece of sector data Sector Data is written to only some of the plurality of layers Layer 1 to Layer 4.

As illustrated in FIG. 11, a sector, which is an example of a data processing unit, may be classified into a plurality of sub-sectors. For example, one piece of sector data Sector Data may be classified into first to fourth sub-sector data Sector1_1 to Sector1_4, which may be provided through the write driver unit 411 of the memory device 410 to the layer selection unit 412. Also, the address ADDR2 according to a layer assignment operation of the memory controller 420 may be provided to the layer selection unit 412.

According to a selection operation of the layer selection unit 412, one piece of sub-sector data may be provided to any one of the plurality of layers Layer 1 to Layer 4 in each tile Tile. For example, first sub-sector data Sector1_1 may be written to a first tile Tile 1 of the first layer Layer 1, second sub-sector data Sector1_2 may be written to a second tile Tile 2 of the fourth layer Layer 4, third sub-sector data Sector1_3 may be written to a third tile Tile 3 of the first layer Layer 1, and forth sub-sector data Sector1_4 may be written to a fourth tile Tile 4 of the fourth layer Layer 4. However, example embodiments of the inventive concepts are not limited to the above-described example of the write operation, and the sector data may be distributed and written to at least two layers in various manners.

Figure 12:
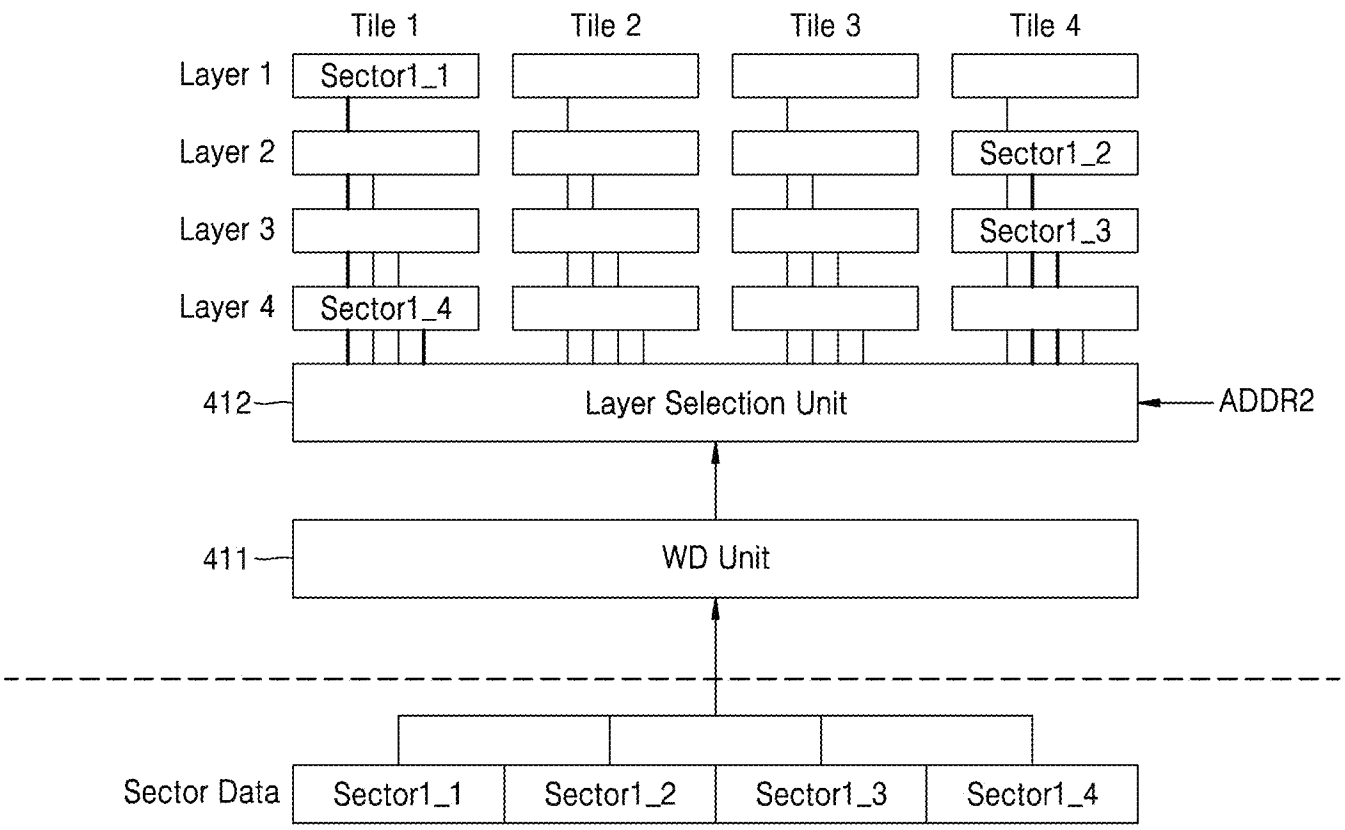

Referring to FIG. 12, alternatively, as illustrated in FIG. 12, at least two sub-sector data may be written to different layers of the same tile. The write driver unit 411 may sequentially receive first to fourth sub-sector data Sector1_1 to Sector1_4 and provide the received sub-sector data to the layer selection unit 412. According to a selection operation of the layer selection unit 412, the sub-sector data may be provided to a layer included in any one tile.

In one example, first sub-sector data Sector1_1 may be provided and written to a first tile Tile1 of the first layer Layer 1, and then second sub-sector data Sector1_2 may be received and written to a fourth tile Tile 4 of the second layer Layer 2. Thereafter, third sub-sector data Sector1_3 may be received and written to a fourth tile Tile 4 of the third layer Layer 3, and then fourth sub-sector data Sector1_4 may be received and written to a first tile Tile1 of the fourth layer Layer 4. However, example embodiments of inventive concepts are not limited to the above-described example of the write operation, and the sector data may be distributed and written to at least two layers in various manners.

Further, while FIG. 12 illustrates an example in which sub-sector data are sequentially provided to the memory device 410, example embodiments of the inventive concepts are not limited thereto. For example, sub-sector data to be written to different tiles may be simultaneously written. Alternatively, sub-sector data to be written to different layers of any one tile may also be simultaneously written. In this case, a selection unit disposed to correspond to any one tile may simultaneously select at least two layers.

Alternatively, the example embodiments described with reference to FIGS. 9, 11, and 12 may be combined with the example embodiments described with reference to FIG. 10. For example, although FIGS. 9, 11, and 12 describe a case in which one piece of sub-sector data (or sub-page data) is written to one tile of one layer, example embodiments of the inventive concepts are not limited thereto. For example, in other example embodiments, the one piece of sub-sector data (or sub-page data) may be written to at least two tiles. Alternatively, at least one piece of sub-sector data (or sub-page data) may be written to one tile.

Figure 13A:
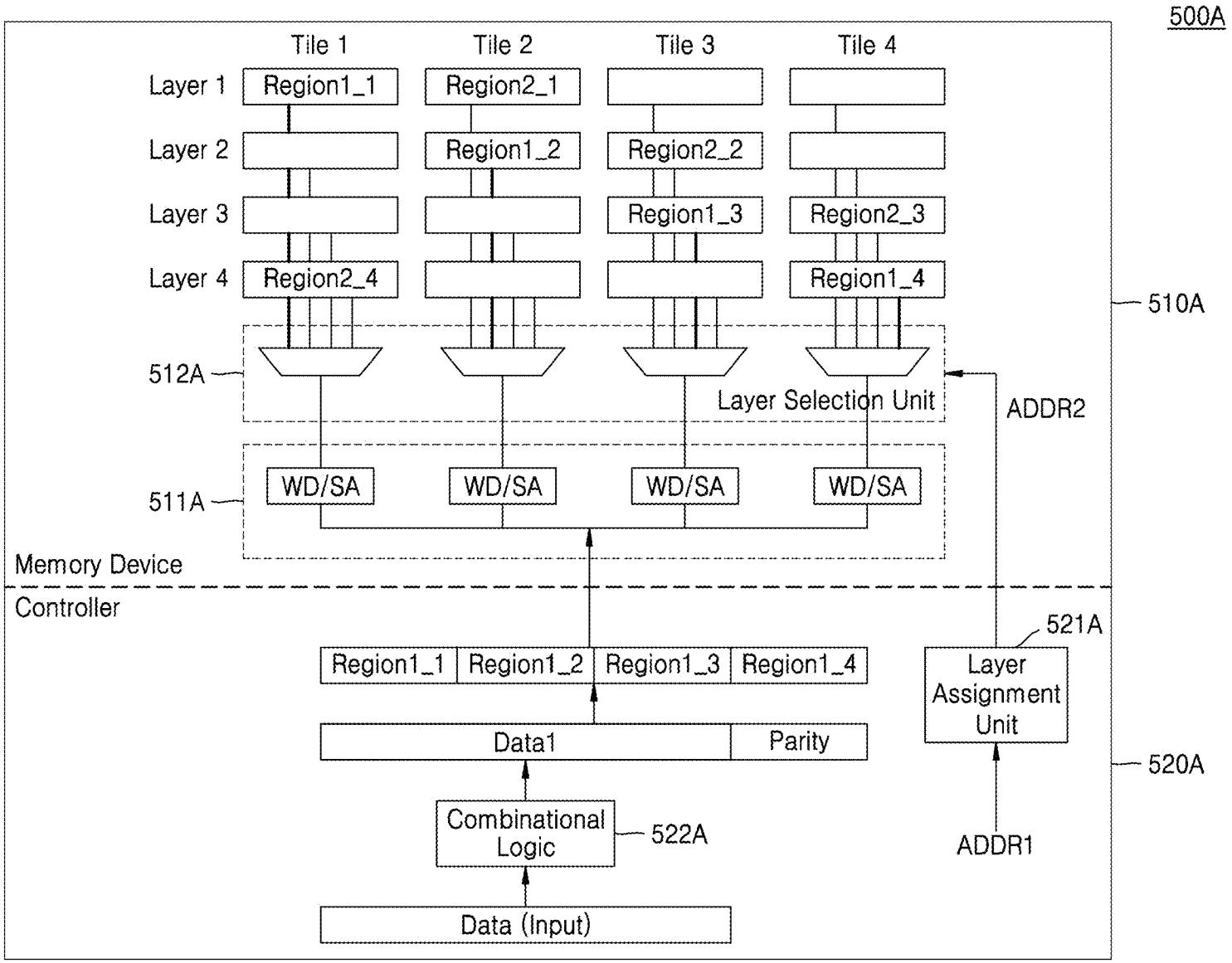
FIGS. 13A and 13B are block diagrams of a memory system according to another example embodiment.
Figure 13B:
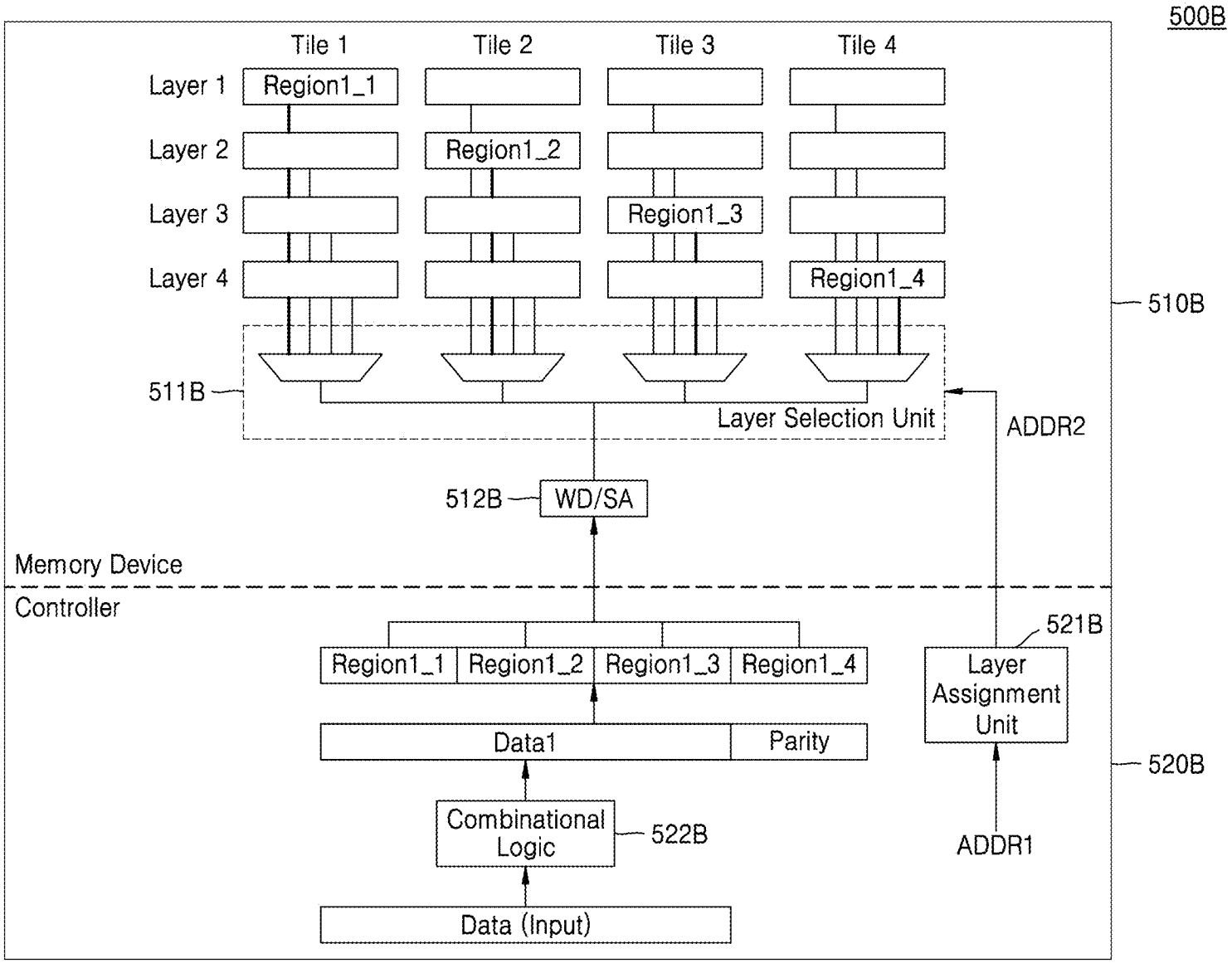

FIGS. 13A and 13B are block diagrams of a memory system according to another example embodiment.

FIG. 13A illustrates an example in which a plurality of pieces of sub-region data are simultaneously accessed, and FIG. 13B illustrates an example in which a plurality of pieces of sub-region data are sequentially accessed. In one example, FIGS. 13A and 13B illustrate four layers Layer 1 to Layer 4 and four tiles Tile1 to Tile 4. Also, FIGS. 13A and 13B illustrate an example in which any one piece of region data is classified into four sub-region data Region1_1 to Region1_4. Although FIGS. 13A and 13B illustrate an example in which memory controllers 520A and 520B process first region data Data1/parity, the memory controllers 520A and 520B may sequentially process second region data, third region data, and other region data.

Referring to FIG. 13A, during a write operation, the first region data Data1/parity may be generated due to a processing operation of a combinational logic 522A, and the first region data Data1/parity may be classified into first to fourth sub-region data Region1_1 to Region1_4. The first to fourth sub-region data Region1_1 to Region1_4 may be provided in parallel to a write/read circuit unit 511A of a memory device 510A. The write/read circuit unit 511A may include a plurality of write driver/sense amplifiers (WD/SAs).

Furthermore, similarly to the above-described example embodiment, a layer assignment unit 521A may receive a first address ADDR1 based on a logical address from a host, perform a layer assignment operation using the first address ADDR1, and provide a second address ADDR2 to a layer selection unit 512A of the memory device 510A as an assignment result. According to a selection operation of the layer selection unit 512A, each piece of sub-region data may be provided to any one of four layers Layer 1 to Layer 4. For example, first sub-region data Region1_1 of the first region data Data1/parity may be written to a first tile Tile1 of a first layer Layer 1, second sub-region data Region1_2 may be written to a second tile Tile 2 of a second layer Layer 2, third sub-region data Region1_3 may be written to a third tile Tile 3 of a third layer Layer 3, and fourth sub-region data Region1_4 may be written to a fourth tile Tile 4 of a fourth layer Layer 4. Also, the first region data Data1/parity may be simultaneously written to a plurality of layers.

Thereafter, a write operation may be performed on the second region data. For example, first sub-region data Region2_1 of the second region data may be written to a second tile Tile 2 of the first layer Layer 1, second sub-region data Region2_2 may be written to a third tile Tile 3 of the second layer Layer 2, third sub-region data Region2_3 may be written to a fourth tile Tile 4 of the third layer Layer 3, and fourth sub-region data Region2_4 may be written to a first tile Tile1 of the fourth layer Layer 4. Other region data may be sequentially written to a similar manner to the above.

During a read operation, sub-region data may be simultaneously read from a plurality of layers. The layer assignment unit 521A may perform a layer assignment operation using the first address ADDR1, and provide the second address ADDR2 to the layer selection unit 512A of the memory device 510A as an assignment result. For example, the first to fourth sub-region data Region1_1 to Region1_4 constituting the first region data may be simultaneously read and provided through sense amplifiers SA to the memory controller 520A.

Alternatively, referring to FIG. 13B, a plurality of pieces of sub-region data included in one region may be sequentially written. In this case, one WD/SA 512B may be shared between at least two sub-region data. A layer assignment unit 521B of a memory controller 520B may perform the same layer assignment operation as in the above-described embodiment and convert a first address ADDR1 into a second address ADDR2. Also, a combinational logic 522B of the memory controller 520B may perform a signal processing operation on input data and generate region data Data1/parity.

First to fourth sub-region data Region1_1 to Region1_4 may be sequentially provided from the memory controller 520B to the WD/SA 512b of the memory device 510B. The first to fourth sub-region data Region1_1 to Region1_4 may be written to at least two layers of a plurality of layers Layer 1 to Layer 4. For example, first sub-region data Region1_1 of the first region data Data1/parity may be written to a first tile Tile1 of a first layer Layer 1, second sub-region data Region1_2 may be written to a second tile Tile 2 of a second layer Layer 2, third sub-region data Region1_3 may be written to a third tile Tile 3 of a third layer Layer 3, and fourth sub-region data Region1_4 may be written to a fourth tile Tile 4 of a fourth layer Layer 4.

According to some example embodiments, as illustrated in FIG. 13B, data write and read operations may be performed in units of sub-regions, while a data processing operation may be performed by the memory controller 520B in units of regions. Thus, sub-region data sequentially read from the memory device 510B may be stored in a predetermined storage unit (not shown) of the memory controller 520B, and the memory controller 520B may perform a processing operation on a region unit of data stored in the storage unit.

Figure 14:
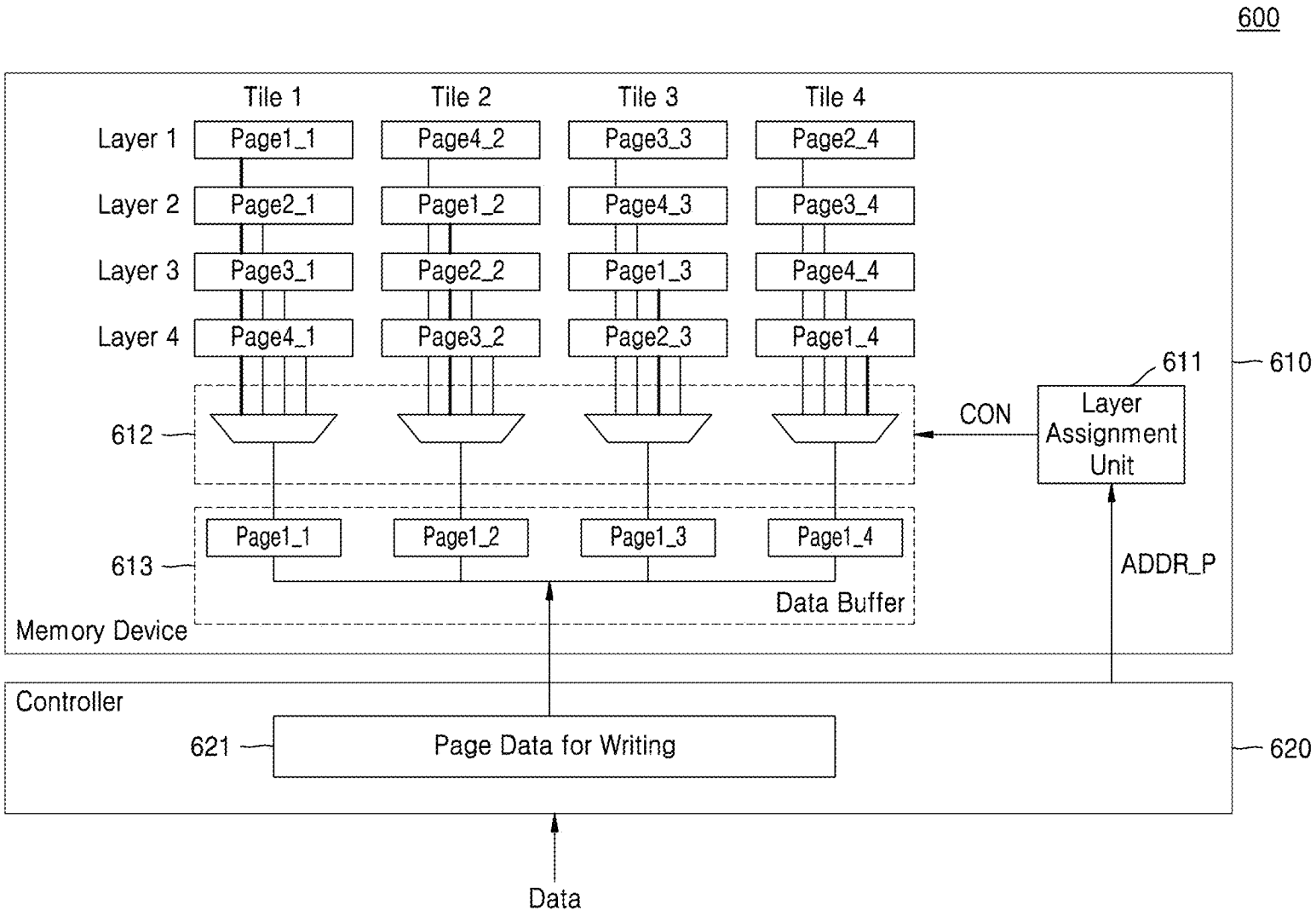
FIG. 14 is a block diagram illustrating an example of an operation of a memory system according to another example embodiment.

FIG. 14 is a block diagram illustrating an example of an operation of a memory system according to other example embodiments.

Referring to FIG. 14, a memory system 600 may include a memory device 610 and a memory controller 620, and the memory controller 620 may process data in units of pages. The memory system 600 may utilize resistive memory cells in place of a NAND flash memory, and the memory controller 620 may maintain an interface of a controller of the NAND flash memory.

The memory controller 620 may include a page buffer 621 configured to temporarily store page data. The memory controller 620 may provide page data to the memory device 610, and provide a physical address ADDR_P generated by the memory controller 620 using firmware (not shown), to the memory device 610. The physical address ADDR_P may include address information indicating positions of one layer and one page in which page data is to be stored from among a plurality of layers.

The memory device 610 may include a layer assignment unit 611, a layer selection unit 612, and a data buffer 613. Also, the memory device 610 may include a plurality of layers Layer 1 to Layer 4 and a plurality of tiles Tile1 to Tile 4. The data buffer 613 may be divided into a plurality of storage spaces, each of which may store data in units of sub-pages Sub_page.

The layer assignment unit 611 may receive a physical address ADDR_P, perform a conversion operation on the physical address ADDR_P, and generate a control signal CON for controlling each of a plurality of selection units included in the layer selection unit 612, as a conversion result. Each of the selection units may be disposed to correspond to a tile, and a sub-page unit of data may be provided through the corresponding selection unit to any one of the plurality of layers Layer 1 to Layer 4. FIG. 14 illustrates an example in which first to fourth sub-page data page1_1 to page1_4 included in one piece of page data (e.g., first page data Page1) are respectively written to different tiles of different layers. However, as described above, example embodiments of the inventive concepts are not limited to the above-described example of the write operation, and the page data may be distributed and written to at least two layers in various manners.

According to some example embodiments, as illustrated in FIG. 14, the physical address ADDR_P provided by the memory controller 620 may include information indicating a position of a specific page in one layer. Also, the memory device 610 may perform the conversion operation by using the physical address ADDR_P and generate the control signal CON for controlling respective sub-page data to be independently assigned to respective tiles and respective layers. In addition, the memory device 610 may perform the conversion operation by using the physical address ADDR_P and further generate row selection information and column selection information indicating positions in which sub-page data is written to one layer and one tile. The row selection information and the column selection information may be generated by the layer assignment unit 611 or another address converting unit (not shown) of the memory device 610.

FIG. 15 is a flowchart for describing a method of operating a memory system according to an example embodiment.

Referring to FIG. 15, FIG. 15 illustrates an example embodiment related to a write operation of the memory system.

In operation S11, the memory system may receive a write request from a host, and receive a first address as a logical address indicating a logical position in which data will be written.

In operation S12, the memory system may receive first data accompanying the write request. For example, the memory system may receive the first data from the host such that the data has a variously set size in response to one write request, for example, at least one piece of region data. The first data may correspond to at least one piece of region data out of data provided by the host. A size of the first data may be variously set. For example, the size of the first data may correspond to a unit of a page including a plurality of sectors or a unit of a sector including a plurality of sub-sectors.

In operation S13, the memory system may generate n sub-region data from the first data. For example, n sub-region data may be generated by performing a classification operation on the first data. In another example, parity data may be generated by performing a signal processing operation (e.g., an ECC encoding operation) on the first data, and n sub-region data may be generated by performing a classification operation on the first data and the parity data. In another example, after a classification operation is first performed on the first data, parity data may be generated by performing a signal processing operation on the classified data, and n sub-region data may be generated from the classified data and the parity data.

In operation S14, a conversion operation is performed on the first address, and, in operation S15, each of the n pieces of sub-region data may be assigned to any one of a plurality of layers based on the address conversion result.

In operation S16, the n sub-region data and the address conversion result may be provided to a memory device, and the memory device may perform a data write operation based on the received n sub-region data and the address conversion result. For example, in some example embodiments, the n sub-region data may be distributed and written to at least two layers of the memory device.

Figure 16:
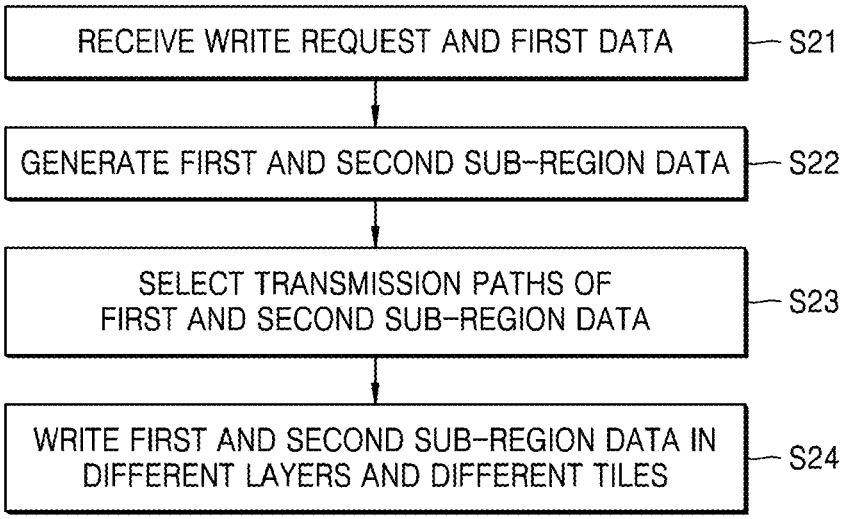
FIG. 16 is a flowchart for describing a method of operating a memory system according to another example embodiment.

FIG. 16 is a flowchart for describing a method of operating a memory system according to another example embodiment.

Referring to FIG. 16, FIG. 16 illustrates a case in which a plurality of layers including memory cells include at least two tiles.

In operation S21, a write request may be received form a host, and first data may be received with the write request.

In operation S22, a plurality of pieces of sub-region data may be generated from the first data in a manner that is the same as or similar to the above-described example embodiment. For example, first and second sub-region data may be generated from the first data.

In operation S23, due to a layer assignment operation of a memory controller or a memory device included in the memory system, transmission paths of the first sub-region data and the second sub-region data may be selected.

In operation S24, the first sub-region data and the second sub-region data may be written to different layers due to the selection of the transmission paths, and provided to different tiles and simultaneously written. In some example embodiments, the first sub-region data may be written to a first layer of a plurality of layers included in a first tile, while the second sub-region data may be written to a second layer of a plurality of layers included in a second tile.

Figure 17A:
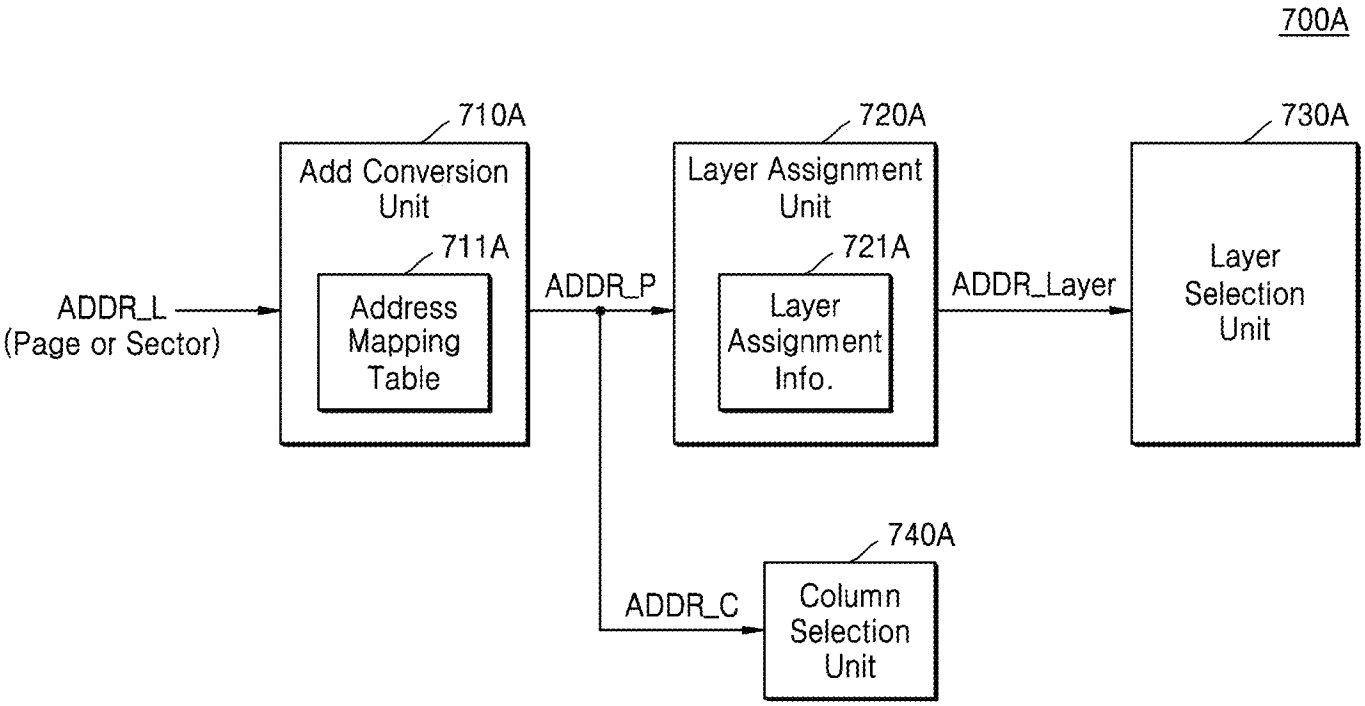
FIGS. 17A and 17B are block diagrams of examples of an operation of a memory system according to other example embodiments.
Figure 17B:
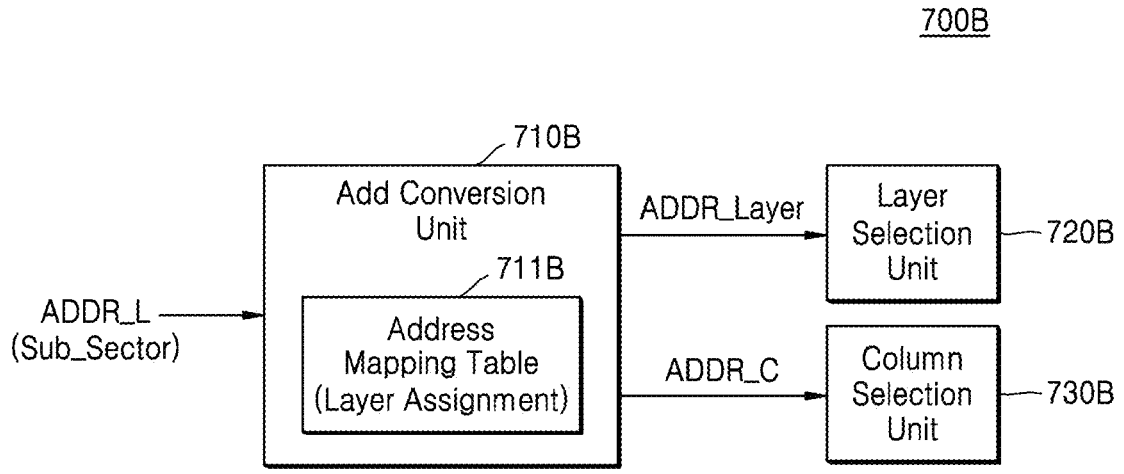

FIGS. 17A and 17B are block diagrams of examples of an operation of a memory system 700A according to other example embodiments.

As shown in FIG. 17A, the memory system 700A may include an address conversion unit 710A, a layer assignment unit 720A, a layer selection unit 730A, and a column selection unit 740A.

The address conversion unit 710A shown in FIG. 17A may be a component included in a memory controller. When the memory controller included in the memory system 700A uses the same interface as a NAND flash memory, the address conversion unit 710A may be a component corresponding to a flash translation layer (FTL) of the NAND flash memory.

The address conversion unit 710A may externally receive a logical address ADDR_L. For example, the logical address ADDR_L may be an address indicating a page or a sector. The address conversion unit 710A may internally include an address mapping table 711A, and convert the logical address ADDR_L into a physical address ADDR_P based on address mapping information. The physical address ADDR_P may include information indicating a position of a page or a sector in which data is to be actually written in a memory cell array included in a memory device. For example, the physical address ADDR_P may include a column address ADDR_C including column information regarding a memory to be accessed, and the column address ADDR_C may be provided to the column selection unit 740A.

Meanwhile, according to some example embodiments, the layer assignment unit 720A may internally include a table 721A including layer assignment information. According to the above-described example embodiment, the layer assignment unit 720A may perform a layer assignment operation using at least part of the information included in the physical address ADDR_P. For example, the layer assignment unit 720A may generate and output a layer address ADDR_Layer, which is mapped to at least some bits of the physical address ADDR_P, referring to layer assignment information, and the layer address ADDR_Layer may be provided to the layer selection unit 730A.

In at least some example embodiments, a unit of a region indicated by the logical address ADDR_L and the physical address ADDR_P may be different from a unit of data written to an actual memory device (e.g., a unit of data written to one tile). That is, when the physical address ADDR_P includes positional information corresponding to one sector, the layer address ADDR_Layer may include layer assignment information regarding each of a plurality of sub-sectors.

As shown in FIG. 17B, a unit of a region indicated by a logical address ADDR_L may be the same as a unit of data written to an actual memory device (e.g., a unit of data written to one tile). As shown in FIG. 17B, a memory system 700B may include an address conversion unit 710B, a layer selection unit 720B, and a column selection unit 730B. A logical address ADDR_L provided by a host is assumed to be an address indicating a sub-sector as in the above-described example embodiment.

The address conversion unit 710B may include an address mapping table 711B, which may include information related to a physical address corresponding to each logical address ADDR_L. In FIG. 17B, the physical address may include information indicating a position in which a sub-sector unit of data is to be accessed. For example, the physical address may include at least a layer address ADDR_Layer for selecting a layer and a column address ADDR_C for selecting a column. The layer address ADDR_Layer may be provided to the layer selection unit 720B, and the column address ADDR_C may be provided to the column selection unit 730B.

According to the example embodiment shown in FIG. 17B, the address mapping table 711B may include mapping information indicating a layer and a position to or from which sub-sector data is to be written or read to correspond to the logical address ADDR_L indicating a position of a sub-sector. Thus, a layer assignment operation according to some example embodiments may be performed during a mapping operation of the address conversion unit 710B without an additional layer assignment process.

Figure 18:
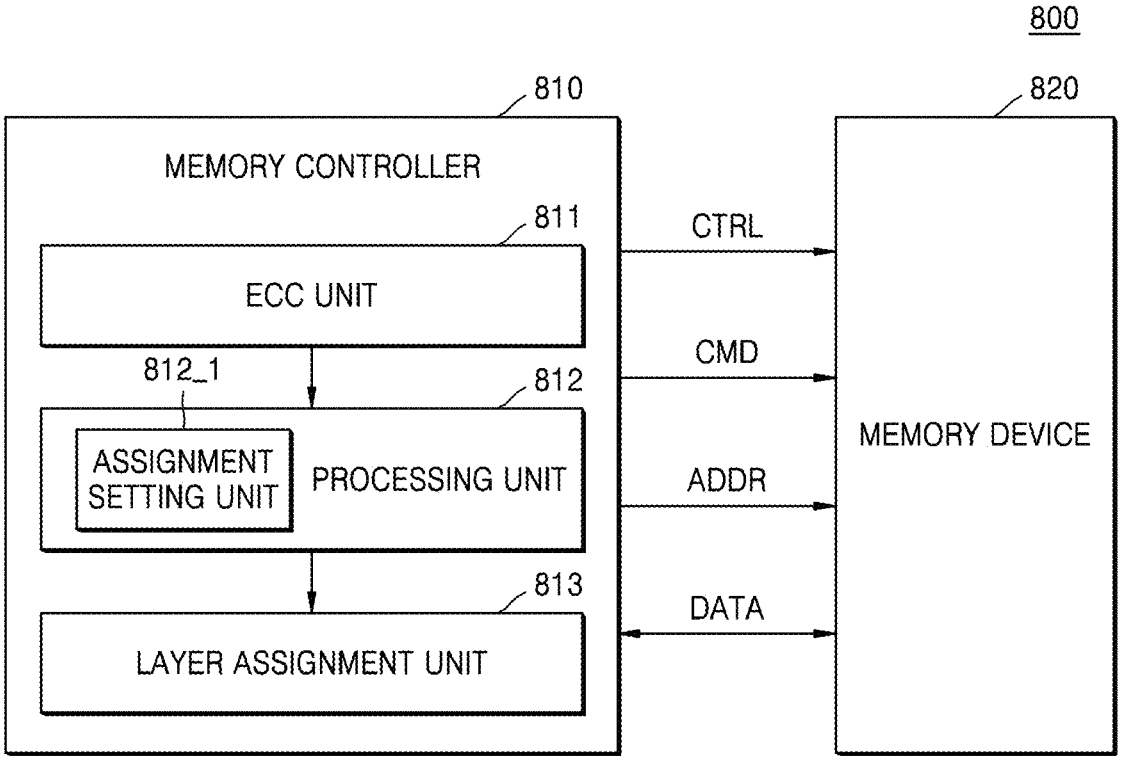
FIG. 18 is a block diagram of a memory system according to another example embodiment.

FIG. 18 is a block diagram of a memory system 800 according to another example embodiment of the inventive concepts.

Referring to FIG. 18, the memory system 800 may include a memory controller 810 and a memory device 820. The memory controller 810 may include an ECC unit 811, a processing unit 812, and a layer assignment unit 813. Also, the processing unit 812 may include an assignment setting unit 812_1.

The memory device 820 may perform a memory operation in response to a control signal CTRL, an address ADDR, and a command CMD received from the memory controller 810. The memory device 820 may receive write data DATA from the memory controller 810 or output read data DATA to the memory controller 810. The memory controller 810 may include the layer assignment unit 813 and perform a layer assignment operation according to the above-described example embodiments.

Since the memory device 820 includes a plurality of layers, as memory operations are cumulated, respective layers may be degraded at different degrees. The ECC unit 811 may detect errors in a plurality of layers included in the memory device 820, and provide a detection result to the processing unit 812. The assignment setting unit 812_1 may determine a layer having a relatively low degree of degradation and a layer having a relatively high degree of degradation based on the error detection result. The assignment setting unit 812_1 may change the setting of layer assignment information included in the layer assignment unit 813, and change a layer assignment operation on a desired (or, alternatively, a predetermined) unit of data.

For example, layer assignment information may be set to distribute and write a unit of data to and in a plurality of specific layers. Thus, although the number of errors caused to the unit of data may be uniformized, characteristics of at least some of the plurality of specific layers may be particularly degraded. In this case, at least one layer in which the predetermined unit of data is written may be changed under the control of the assignment setting unit 812_1, so that the number of errors caused to the predetermined unit of data may remain uniformized.

Figure 19:
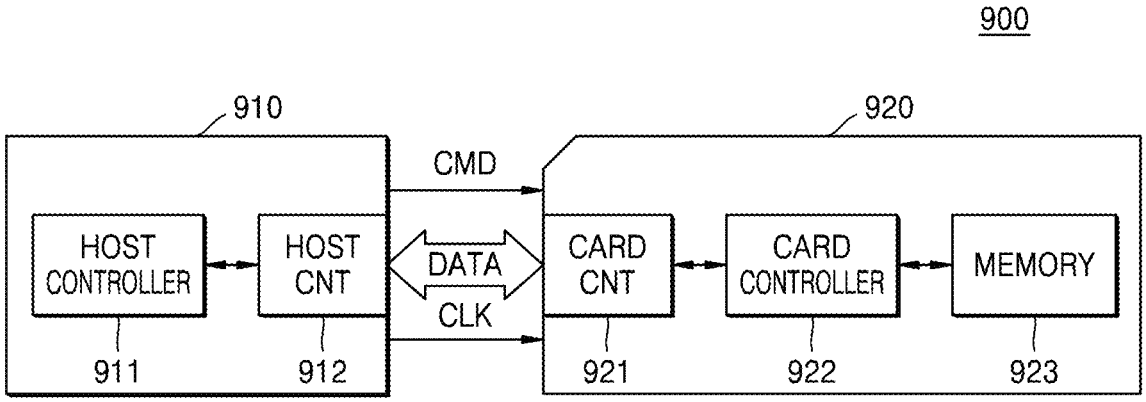
FIG. 19 is a block diagram illustrating an example of applying a memory system according to any one of the example embodiments to a memory card system.

FIG. 19 is a block diagram illustrating an example of applying the memory system according to any one of the above-described example embodiments to a memory card system 900. The memory system is assumed to be a resistive memory system.

Referring to FIG. 19, the memory card system 900 may include a host 910 and a memory card 920. The host 910 may include a host controller 911 and a host connector 912. The memory card 920 may include a card connector 921, a card controller 922, and a memory system 923. The memory system 923 may be embodied using one or more of the example embodiments illustrated in FIGS. 1 to 18. Accordingly, the memory system 923 may include a memory controller and a resistive memory device, and any one piece of region data may be classified into a plurality of pieces of sub-region data and controlled to be distributed to and stored in a plurality of layers.

The host 910 may write data to the memory card 920 or may read data stored in the memory card 920. The host controller 911 may transmit a command CMD, a clock signal CLK generated by a clock generator (not shown) in the host 910, and data DATA, to the memory card 920 via the host connector 912.

The card controller 922 in response to the command CMD received through the card connector 921 may store the data DATA in the memory device 923 in synchronism with the clock signal CLK generated by the clock generator in the card controller 922. The memory device 923 may store the data DATA transmitted from the host 910.

The memory card 920 may be embodied by a compact flash card (CFC), a microdrive, a smart media card (SMC), a multimedia card (MMC), a security digital card (SDC), a memory stick, a USB flash memory driver, etc.

Figure 20:
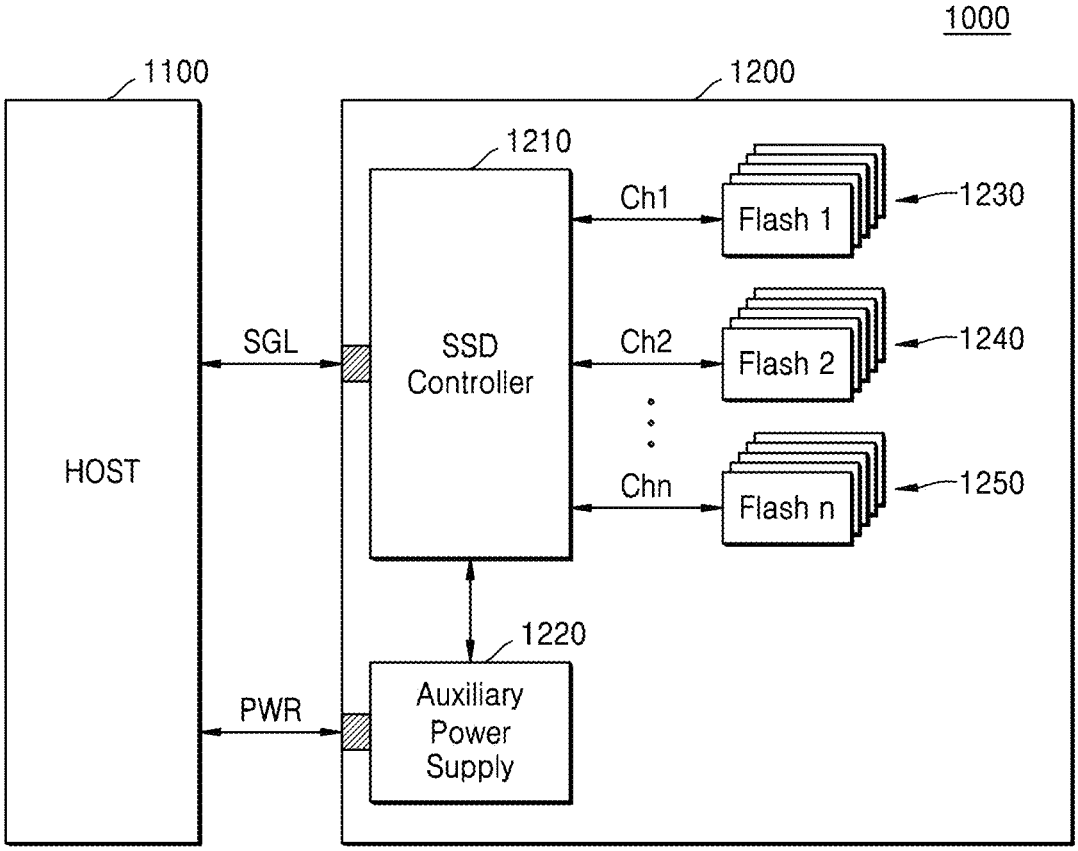
FIG. 20 is a block diagram illustrating an example of applying the memory system according to any one of the example embodiments to a solid state drive (SSD) system.

FIG. 20 is a block diagram illustrating an example of applying the memory system according to any one of the above-described example embodiments to a solid state drive SSD system 1000.

Referring to FIG. 20, the SSD system 1000 may include a host 1100 and an SSD 1200. The SSD 1200 may exchange signals with the host 1100 via a signal connector (not shown) and may receive an input of power through a power connector (not shown). The SSD 1200 may include an SSD controller 1210, an auxiliary power supply 1220, and a plurality of memory systems 1230, 1240, and 1250. In this case, each of the memory systems 1230, 1240, and 1250 may be embodied using one or more of the example embodiments illustrated in FIGS. 1 to 18. Accordingly, each of the memory systems 1230, 1240, and 1250 may be controlled such that any one piece of region data is classified into a plurality of pieces of sub-region data and distributed to and stored in a plurality of layers.

Figure 21:
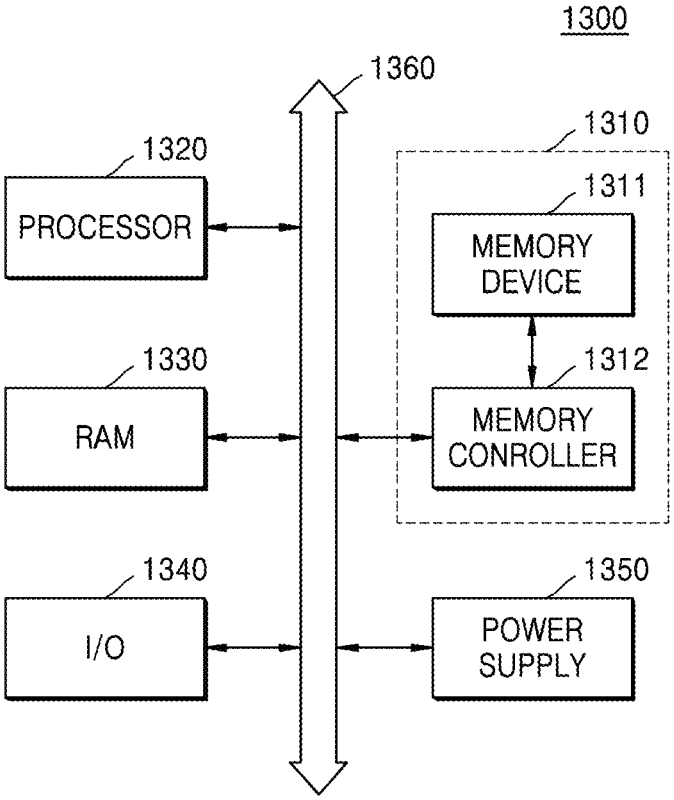
FIG. 21 is a block diagram of a computing system including the memory system according to any one of the example embodiments.

FIG. 21 is a block diagram of a computing system 1300 including a memory system 1310 according to any one of the above-described example embodiments. The memory system 1310 is assumed to be a resistive memory system.

Referring to FIG. 21, the computing system 1300 may include the memory system 1310, a processor 1320, RAM 1330, an input/output (I/O) device 1340, and a power supply 1350. Also, the memory system 1310 may include a memory device 1311 and a memory controller 1312. Alternatively, although it is not illustrated in FIG. 21, the computing system 1300 may further include ports that may communicate with a video card, a sound card, a memory card, a USB device, etc. or other electronic devices. The computing system 1300 may be embodied by a personal computer or a portable electronic apparatus such as a laptop computer, a mobile phone, a personal digital assistant (PDA), and a camera.

The processor 1320 may perform particular calculations or tasks. In some example embodiments, the processor 1320 may be a micro-processor or a central processing unit (CPU). The processor 1320 may perform communication with the RAM 1330, the I/O device 1340, and the memory system 1310 via a bus 1360 such as an address bus, a control bus, and a data bus. The memory system 1310 and/or the RAM 1330 may be embodied by using the example embodiments illustrated in one or more of FIGS. 1 to 18.

According to some example embodiments, the processor 1320 may be connected to an extended bus such as a peripheral component interconnect (PCI) bus.

The RAM 1330 may store data needed for the operation of the computing system 1300. As described above, the memory device according to some example embodiments may be employed as the RAM 1330. Alternatively, other memories such as dynamic RAM (DRAM), mobile DRAM, static RAM (SRAM), PRAM, ferroelectric RAM (FRAM), MRAM, etc. may be used as the RAM 1330.

The I/O device 1340 may include an input device such as a keyboard, a keypad, or a mouse, and an output device such as a printer or a display. The power supply 1350 may supply an operating voltage needed for the operation of the computing system 1300.

While example embodiments of the inventive concepts have been particularly shown and described with reference to some example embodiments thereof, it will be understood that various changes in form and details may be made therein without departing from the spirit and scope of the following claims.

What is claimed is:

1. A method of operating a cross-point memory including a memory device, the memory device including a memory cell array, the method comprising:

receiving a write request and write data, the write data corresponding to a first address;

generating parity data from the write data;

assigning a first region data including the write data and the parity data into a plurality of sub-region data;

converting the first address into a plurality of second addresses by converting the first address to a first physical address corresponding to the first region data, and converting the first physical address to the plurality of second addresses corresponding to the plurality of sub-region data, the plurality of second addresses for uniformizing bit error rates (BERs) among a plurality of region data; and distributing and storing the first region data to a plurality of positions in the memory cell array by writing the plurality of sub-region data according to the plurality of second addresses,

*wherein each region data of the plurality of region data and each sub-region data of the plurality of sub-region data are units of data for the distributing and storing of the write data and the parity data.*

2. The method of claim 1, wherein the memory cell array includes a plurality of tiles connected to respective ones of a plurality of write drivers, and the plurality of sub-region data are distributed and stored into the plurality of tiles,

*wherein each tile of the plurality of tiles includes a memory cell region, a row selection unit, and a column section unit.*

3. The method of claim 1, wherein the method further comprises:

receiving a read request and the first address, converting the first address to the plurality of second addresses in response to the read request, and reading the distributed and stored first region data based on the plurality of second addresses.

4. The method of claim 1, wherein the memory cell array includes a plurality of layers, each of the plurality of layers including memory cells, wherein the first region data is distributed and stored into the plurality of layers.

5. The method of claim 4, wherein the plurality of second addresses includes layer selection information for indicating which of the plurality of layers to store the first region data.

6. The method of claim 4, wherein adjacent layers among the plurality of layers share at least one of wordlines and bitlines with each other.

7. The method of claim 4, wherein the memory device includes a plurality of tiles, the plurality of tiles including a first tile and a second tile, the first tile including first memory cells disposed in at least two layers of the plurality of layers, and the second tile including second memory cells disposed in the at least two layers, wherein the first region data is distributed and stored into different ones of the first tile and the second tile in different ones of the at least two layers,

*wherein each tile of the plurality of tiles includes a memory cell region, a row selection unit, and a column section unit.*

8. A cross-point memory comprising:

a memory controller configured to control a memory device including a plurality of layers forming a memory cell array, the memory controller configured to generate control signals by, calculating parity data from a write data according to a write request and generate a first region data including the write data and the parity data, converting a first address related to the write data into a plurality of second addresses related to a plurality of sub-region data classified from the first region data by converting the first address to a first physical address corresponding to the first region data, and converting the first physical address to the plurality of second addresses corresponding to the plurality of sub-region data, the plurality of second addresses for uniformizing bit error rates (BERs) among a plurality of region data, and generate the control signals such that based on the control signals of the memory controller, the plurality of sub-region data are distributed and stored in the plurality of layers according to the plurality of second addresses,

*wherein each region data of the plurality of region data and each sub-region data of the plurality of sub-region data are units of data for the distributing and storing of the write data and the parity data.*

9. The cross-point memory of claim 7, wherein each of the plurality of sub-region data includes a part of the write data and a part of the parity data.

10. A method of operating a cross-point memory, the cross-point memory including a plurality of layers forming a memory cell array, the memory cell array classified into a plurality of tiles connected to respective ones of a plurality of write drivers, the method comprising:

generating first sub-region data and second sub-region data from first region data, the first region data accompanying a first write request;

selecting a path for transmitting the first and second sub-region data to the plurality of layers; and writing the first sub-region data to a first tile of the plurality of tiles within a first layer of the plurality of layers and writing the second sub-region data to a second tile of the plurality of tiles within a second layer of the plurality of layers such that the first region data is distributed and stored into different ones of the first tile and the second tile in different ones of the plurality of layers,

*wherein first region data and second sub-region data are units of data for the distributing and storing or reading of data, and*

*wherein each tile of the plurality of tiles includes a memory cell region, a row selection unit, and a column section unit.*

11. The method of claim 10, further comprising:

generating third sub-region data and fourth sub-region data from second region data, the second region data accompanying a second write request;

selecting a path for transmitting the third and fourth sub-region data to the plurality of layers; and writing the third sub-region data to the second layer of the first tile and writing the fourth sub-region data to the first layer of the second tile.

12. The method of claim 10, wherein the writing simultaneously writes the first and second sub-region data.

13. The method of claim 10, wherein the first write request includes a first address corresponding to the first region data, and the selecting of the path comprises:

converting the first address into a control signal based on layer assignment information included in the cross-point memory; and selecting a layer of the plurality of layers based on the control signal.

14. A method of operating a memory controller, the memory controller configured to control a write operation on memory cells disposed in a plurality of layers of a memory device, the method comprising:

receiving, from a host, a write request and data corresponding to the write request, the write request includes a first address corresponding to region data;

generating n pieces of sub-region data from region data by performing a first processing operation on the data;

assigning the n pieces of region data to the plurality of layers based on an address conversion operation, the address conversion operation including converting the first address to a first physical address corresponding to the region data, and converting the first physical address to a plurality of second addresses corresponding to the n pieces of sub-region data for uniformizing bit error rates (BERs) among the plurality of region data; and controlling the write operation to write at least two of the region data in different layers according to the plurality of second addresses, wherein n is an integer equal to or larger than 2.

15. The method of claim 14, wherein the first address is a logical address and the first physical address is a physical addresses, and the method further comprises:

generating a layer selection signal using the first physical address and layer assignment information, wherein the controlling of the write operation comprises outputting the layer selection signal to the memory device including the plurality of layers.

16. The method of claim 14, wherein the first processing operation performed on the data is an encoding operation of generating parity data from the data.

17. The method of claim 14, wherein the first processing operation is performed on sector data included in the data, and each of the n pieces of sub-region data is sub-sector data.

18. A cross-point memory comprising:

a memory cell array including resistive memory cells included in a plurality of layers;

a read/write circuit configured to perform a write operation and a read operation on the resistive memory cells; and processing circuitry configured to, control the write operation and the read operation on the resistive memory cells according to a received command and a received address, and assign data accompanying the received command to the plurality of layers, wherein a plurality of pieces of sub-region data to which region data corresponding to a first address is classified into that are simultaneously written to at least two layers, the region data including at least a portion of the data corresponding to the first address and parity data corresponding to the at least a portion of the data, and each of the plurality of pieces of sub-region data include a portion of the parity data,

*wherein region data and each piece of sub-region data of the plurality of pieces of sub-region data are units of data for the distributing, storing, and reading of data.*

19. The cross-point memory of claim 18, wherein the memory cell array comprises a plurality of tiles, and the processing circuitry is configured to control the write operation such that at least two pieces of the sub-region data is simultaneously written to different layers of different tiles,

*wherein each tile of the plurality of tiles includes a memory cell region, a row selection unit, and a column section unit.*

* * * * *